(12) United States Patent
Tsujimoto

(10) Patent No.: US 9,903,900 B2
(45) Date of Patent: Feb. 27, 2018

(54) ELECTRIC LEAKAGE DETECTING APPARATUS

(71) Applicant: OSAKA CITY UNIVERSITY, Osaka (JP)

(72) Inventor: Hiroaki Tsujimoto, Osaka (JP)

(73) Assignee: OSAKA CITY UNIVERSITY, Osaka (JP)

( * ) Notice: Subject to any disclaimer, the term of this patent is extended or adjusted under 35 U.S.C. 154(b) by 391 days.

(21) Appl. No.: 14/406,690

(22) PCT Filed: Jun. 12, 2013

(86) PCT No.: PCT/JP2013/003677
§ 371 (c)(1),
(2) Date: Jan. 28, 2015

(87) PCT Pub. No.: WO2013/187057
PCT Pub. Date: Dec. 19, 2013

(65) Prior Publication Data
US 2015/0153401 A1 Jun. 4, 2015

(30) Foreign Application Priority Data
Jun. 12, 2012 (JP) .................. 2012-133312

(51) Int. Cl.
*G01R 31/02* (2006.01)
*G01R 33/09* (2006.01)
(Continued)

(52) U.S. Cl.
CPC ......... *G01R 31/024* (2013.01); *G01R 15/205* (2013.01); *G01R 15/207* (2013.01);
(Continued)

(58) Field of Classification Search
None
See application file for complete search history.

(56) References Cited

U.S. PATENT DOCUMENTS 4,477,768 A 10/1984 Hiramoto
5,517,104 A * 5/1996 Kawakami ........... G01R 15/183
324/117 R
(Continued)

FOREIGN PATENT DOCUMENTS

CN 1111753 A 11/1995
CN 2610342 Y 4/2004
(Continued)

OTHER PUBLICATIONS

Wang, et al. Plaint Maintenance Engineering, vol. 74, p. 15, Dec. 31, 1990.
(Continued)

Primary Examiner — Jermele M Hollington
Assistant Examiner — Suresh K Rajaputra
(74) Attorney, Agent, or Firm — Pearne & Gordon LLP

(57) ABSTRACT

There is a limit on the miniaturization of electric leakage detecting apparatuses including a ring-shaped magnetic material. Any thicker electric wires increase the size of the ring-shaped magnetic material. Additionally, it is difficult to place the ring-shaped magnetic material around the electric wires that have already been placed. In light of the foregoing, an electric leakage apparatus is provided. The electric leakage detecting apparatus is to be installed on a pair of power source lines connecting a power source and a load, and includes: a pair of holders configured to hold the power source lines, respectively; a fixing means configured to fix the holders at a predetermined interval; a pair of magnetic elements each placed on each of the holders while being parallel to the power source lines; a detecting means configured to detect a difference between magneto-resistance effects of the magnetic elements; and a driving means configured to feed a drive current to the magnetic elements.

17 Claims, 24 Drawing Sheets

(51) Int. Cl.
  *G01R 33/06* (2006.01)
  *G01R 15/20* (2006.01)
  *H01H 83/02* (2006.01)
  *H02H 3/33* (2006.01)

(52) U.S. Cl.
  CPC ......... *G01R 31/025* (2013.01); *G01R 33/063* (2013.01); *G01R 33/09* (2013.01); *H01H 83/02* (2013.01); *H02H 3/33* (2013.01)

(56) References Cited

U.S. PATENT DOCUMENTS

| | | | | |
|---|---|---|---|---|
| 5,986,444 | A * | 11/1999 | Powell | G01R 15/205 324/117 R |
| 6,310,470 | B1 * | 10/2001 | Hebing | G01R 15/205 324/117 R |
| 6,731,105 | B1 * | 5/2004 | Hoyle | G01R 15/207 324/117 R |
| 7,463,016 | B2 * | 12/2008 | Shoji | G01R 15/205 324/117 R |
| 2006/0219436 | A1 * | 10/2006 | Taylor | G01R 15/202 174/529 |
| 2007/0063690 | A1 * | 3/2007 | De Wilde | G01R 15/20 324/117 R |
| 2007/0262779 | A1 | 11/2007 | Kirk | |
| 2008/0232007 | A1 | 9/2008 | Musat | |
| 2010/0237450 | A1 * | 9/2010 | Doogue | B82Y 25/00 257/427 |

FOREIGN PATENT DOCUMENTS

| | | |
|---|---|---|
| CN | 101615808 A | 12/2009 |
| CN | 102004203 A | 4/2011 |
| JP | 63-210781 A | 9/1988 |
| JP | 03-103710 A | 4/1991 |
| JP | 10-232259 A | 9/1998 |
| JP | 11-281699 A | 10/1999 |
| JP | 2008-298753 A | 12/2008 |

OTHER PUBLICATIONS

Wu, et al. North China Electric Power, vol. 2, p. 52-54, Dec. 31, 2003.
Chinese office Action and Search Report dated May 27, 2016 for CN201380030909.5.
International Search Report for Application No. PCT/JP2013/003677 dated Sep. 17, 2013.
Supplementary European Search Report issued in Application No. EP 13 80 4351 dated May 9, 2016.

* cited by examiner

ELECTRIC LEAKAGE DETECTING APPARATUS

TECHNICAL FIELD

The present invention relates to an electric leakage detecting apparatus that detects electric leakage.

BACKGROUND ART

Electric leakage is that a current flows out of an electric wire connected from a power source to a load. The electric leakage is actually detected according to the difference between the current flowing from the power source to the load and the current returning from the load to the power source. A conventional electric leakage detecting apparatus is proposed as an apparatus configured to detect the variations in the impedance of a ring-shaped magnetic material by passing two electric wires communicating a power source with a load through the hole of the magnetic material (Patent Literature 1).

An electric leakage detecting apparatus 100 is schematically illustrated in FIG. 24. The electric leakage detecting apparatus 100 includes a ring-shaped magnetic material 101, a magnetic impedance element 102 attached to the magnetic material 101, and a detector 103 configured to detect the variations in the impedance. A pair of electric wires 110 and 111 (referred to as an electric wire A and an electric wire B) extending from a power source 115 to a load 116 pass through a hole 104 of the ring-shaped magnetic material 101.

A magnetoresistive element of which resistance varies depending on the magnetic field is used as the magnetic impedance element 102. The magnetoresistive element is placed in the magnetic field that the ring-shaped magnetic material 101 generates. For example, a part of the ring-shaped magnetic material 101 is removed to form a gap, and then the magnetoresistive element can be placed in the gap. Needless to say, another manner is acceptable.

The detector 103 can be any material as long as the material can detect the variations in the resistance of the magnetoresistive element. The detector 103, for example, converts the variations in the resistance into a signal having a predetermined frequency, or reshapes a waveform using a filter circuit and an amplifier circuit, and then outputs the signal from a signal detection circuit to convert the signal into a main signal.

The operation of the electric leakage detecting apparatus 100 will be described. Without electric leakage, the current flowing in the electric wire A110 has the same amount as the current flowing in the electric wire B111 and the currents flow in the opposite directions. Thus, no magnetic flux arises in the ring-shaped magnetic material 101. Consequently, the resistance of the magnetic impedance element 102 does not vary at that time. On the other hand, with electric leakage, the current flowing in the electric wire A110 has a value different from the value of the current flowing in the electric wire B111. This generates magnetic flux in the ring-shaped magnetic material 101.

The generated magnetic flux varies the impedance of the magnetic impedance element 102. The detector 103 detects the generation of the electric leakage by detecting the variation.

CITATION LIST

Patent Literature

Patent Literature 1: JP 10-232259 A

SUMMARY OF INVENTION

Technical Problem

The electric leakage detecting apparatus in Patent Literature 1, which has a simple configuration, can be miniaturized to some extent. However, the electric leakage detecting apparatus uses the ring-shaped magnetic material. This naturally limits the miniaturization. Additionally, it is necessary to pass the electric wire A and electric wire B extending from the power source through the hole of the ring. A thicker electric wire increases the size of the ring-shaped magnetic material 101. Additionally, it is difficult to place the ring-shaped magnetic material 101 around the electric wires that have already been placed. For example, it is necessary to make a part of the ring-shaped magnetic material openable so as to put the electric wires from the opened part into the hole, and subsequently close the opened part again to form the closed paths of the magnetic flux, similarly to a clamp-on ammeter.

Additionally, it is necessary to simultaneously surround the two power source line patterns extending from the power source with the magnetic material while the miniaturization of the electric leakage detecting apparatus causes the integration of the circuit substrate. This makes it extremely difficult to attach the ring-shaped magnetic material 101 to the power source line patterns afterward.

Solution to Problem

The present invention has been developed in light of the foregoing. The present invention is an electric leakage detecting apparatus that is easy to install even on a circuit that has already been wired, and is capable of being miniaturized. More concretely, the electric leakage detecting apparatus according to the present invention is to be installed on a pair of power source lines connecting a power source and a load, and the electric leakage detecting apparatus includes:

a pair of holders configured to hold the pair of power source lines, respectively;

a fixing means configured to fix the pair of holders at a predetermined interval;

a pair of magnetic elements each placed on each of the holders while being parallel to the power source lines;

a detecting means configured to detect a difference between magneto-resistance effects of the pair of magnetic elements; and a driving means configured to feed a drive current to the magnetic elements.

Advantageous Effects of Invention

The electric leakage detecting apparatus according to the present invention can readily be installed even on a circuit that has already been wired, taking advantage of a magnetoresistive element, for example, the non-contacting (principle), the easy installation (the extremely-compact and thin), and the energy conservation (the low energy consumption for measurement). Additionally, fixing the placed position of the magnetoresistive elements with regard to the electric wire A and the electric wire B can sufficiently suppress the effect of the magnetic field from the adjacent electric wire. This can stably detect an electric leakage. Providing a bias means on the magnetoresistive element also enables electric power measurement and current measurement.

DESCRIPTION OF EMBODIMENTS

The electric leakage detecting apparatus according to the present invention will be described hereinafter with reference to the appended drawings. Note that each description below is an exemplary embodiment of the present invention. The present invention is not limited to the embodiments to be described below. The embodiments to be described below can be changed as long as the change does not depart from the gist of the present invention.

(First Embodiment)

Figure 1:
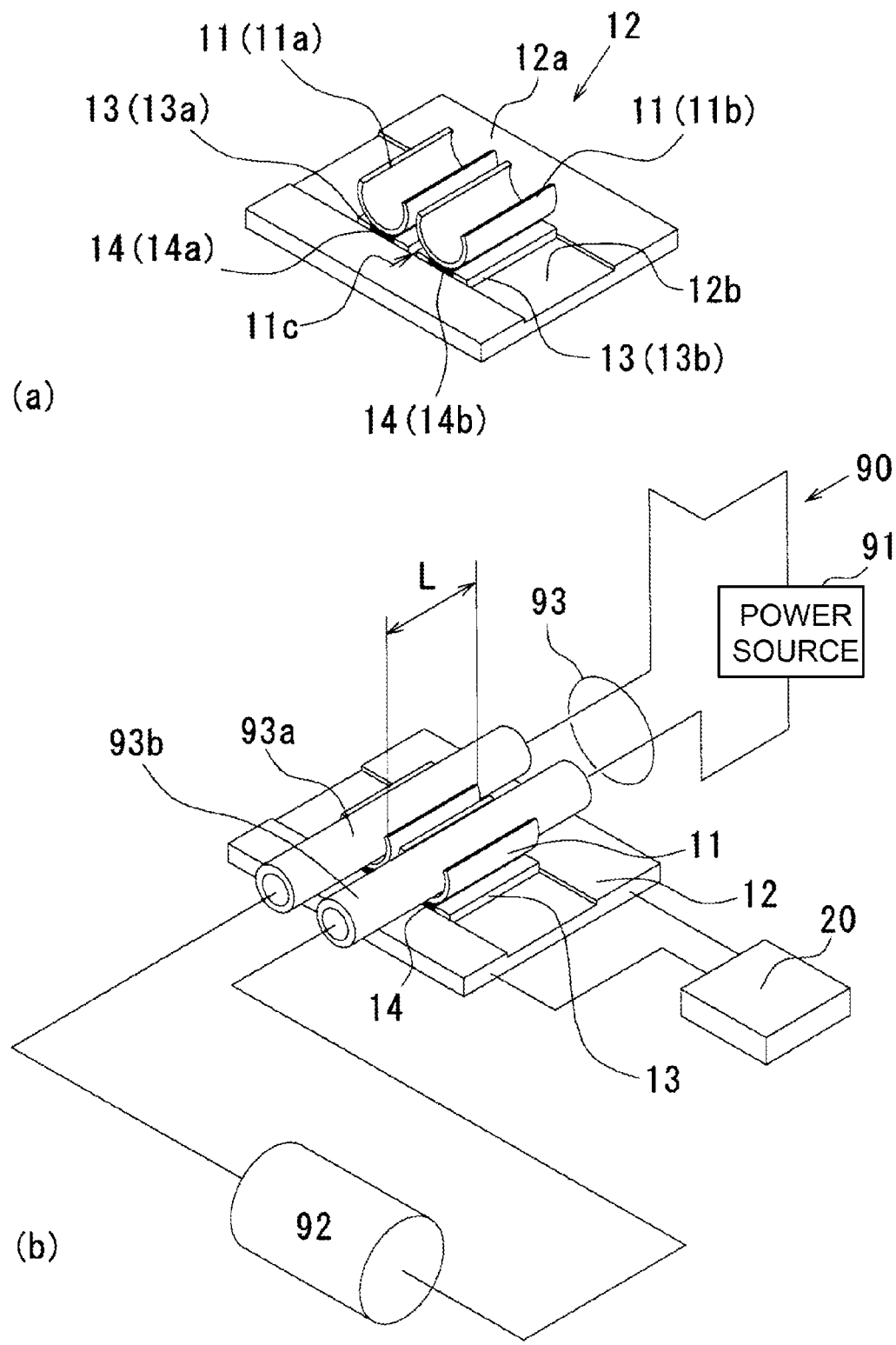
FIGS. 1(a) and 1(b) are views of the structure of an electric leakage detecting apparatus according to the present invention.

FIG. 1 is a view of the appearance of an electric leakage detecting apparatus 1 according to the present embodiment. FIG. 1(a) illustrates the appearance of a part holding electric wires. FIG. 1(b) illustrates the structure of the connection relation with a to-be-detected circuit. With reference to FIG. 1(b), the to-be-detected circuit 90 includes a power source 91, a load 92, and power source lines 93 connecting the power source 91 to the load 92. The power source lines 93 include an electric wire A93a and an electric wire B93b.

The electric leakage detecting apparatus 1 according to the present invention includes a pair of holders 11 configured to hold each of the pair of the power source lines 93, a fixing means 12 configured to fix the interval between the holders 11, magnetic elements 14 embedded in the holders 11, and a detecting means 20 configured to detect the difference between the magneto-resistance effects of the magnetic elements 14. The connection relation between the magnetic elements 14 and the detecting means 20 will be described in detail below.

FIG. 1(a) illustrates the part including the holders 11, the fixing means 12, and the magnetic elements 14, and FIG. 1(a) omits the detecting means 20.

The power source lines 93 are a pair of electric wires (the electric wire A93a and the electric wire B93b) that supply electric power from the power source 91 to the load 92. The power source 91 can be an alternating-current power source or a direct-current power source. The load 92 can have impedance without complex component or reactance (including capacitive and inductive) with complex component.

With reference to FIG. 1(a), each of the holders 11 linearly fixes each of the electric wires (the electric wire A93a and the electric wire B93b) of the power source lines 93 over a predetermined length. Thus, the holders 11 are provided in a pair (11a and 11b). The shapes of the holders 11 are not especially limited while FIG. 1 illustrates cylindrical holding members of which cross-sectional surfaces are partially chipped. Each of the holders 11 linearly fixes a part of each of the power source lines 93 over a predetermined length (L) as illustrated in FIG. 1(b).

Tabular insertion means 13 are formed under the holders 11. Magnetic elements 14 (A14a and B14b) are provided on the insertion means 13, parallel to the fixed electric wire (A93a and B93b). Thus, when the holders 11 hold the electric wire (A93a and B93b), the magnetic elements 14 are placed parallel to the lengthwise direction of the electric wire (A93a and B93b).

The fixing means 12 fixes the interval between the holders 11 at a predetermined length. For example, the fixing means 12 can be a tubular member 12a on which a rail-shaped groove 12b is formed. Allowing the insertion means 13, which are provided under the lower surfaces of the holders 11, to be movably fitting along the groove 12b can make the distance between the holders 11 variable. Needless to say, when the distance between the holders 11 reaches a desired distance, the holders 11 can be fixed on the groove 12b.

For the fixation, the insertion means 13 can be fastened on the fixing means 12, for example, with a screw. The part configured to adjust the interval between the holders 11 described above is referred to as an interval adjuster. In the present embodiment, the interval adjuster is formed of the groove 12b, the insertion means 13, and a screw. However, the interval adjuster can be implemented in another method.

Figure 2:
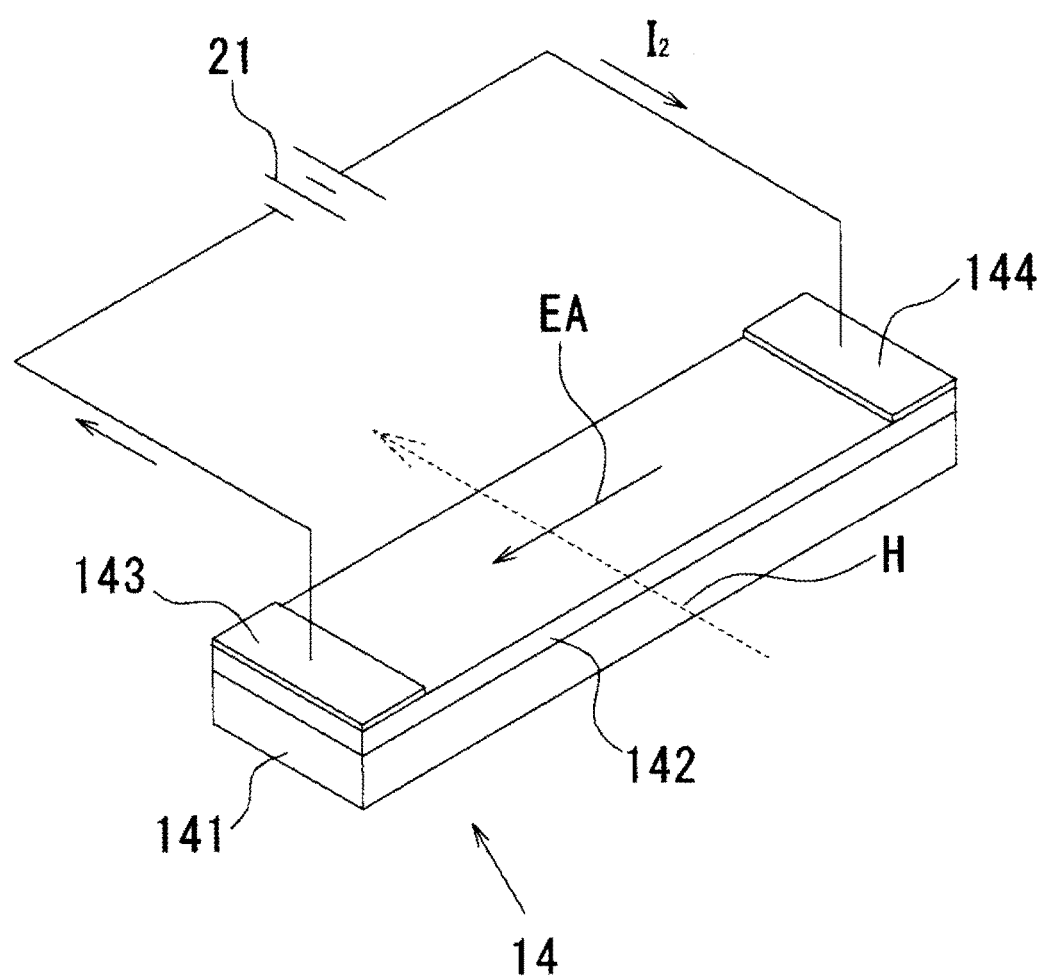
FIG. 2 is an enlarged view of a magnetic element.

The magnetic elements 14 used in the present invention will be described hereinafter. With reference to FIG. 2, the magnetic elements 14 are obtained by forming a magnetic film 142 on a substrate 141 and forming element terminals (electrodes) 143 and 144 on both ends of the magnetic film 142. The magnetic film 142 has a striped shape. The direction in which the element terminals 143 and 144 are formed is referred to as a longitudinal direction. It is preferable that a magnetization easy axis EA is induced on the magnetic film 142 in the longitudinal direction.

A current $I_2$ is applied to the magnetic element 14 from the detector power source 21. The current $I_2$ flows in the magnetic film 142 in the longitudinal direction. Applying a magnetic field H from a direction perpendicular to the longitudinal direction at that time varies the electric resistance of the magnetic film 142. This is referred to as a magneto-resistance effect. It is considered that the magneto-resistance effect is caused by the change of the directions of the current $I_2$ flowing in the magnetic film 142 and of the magnetization in the magnetic film 142.

Figure 3:
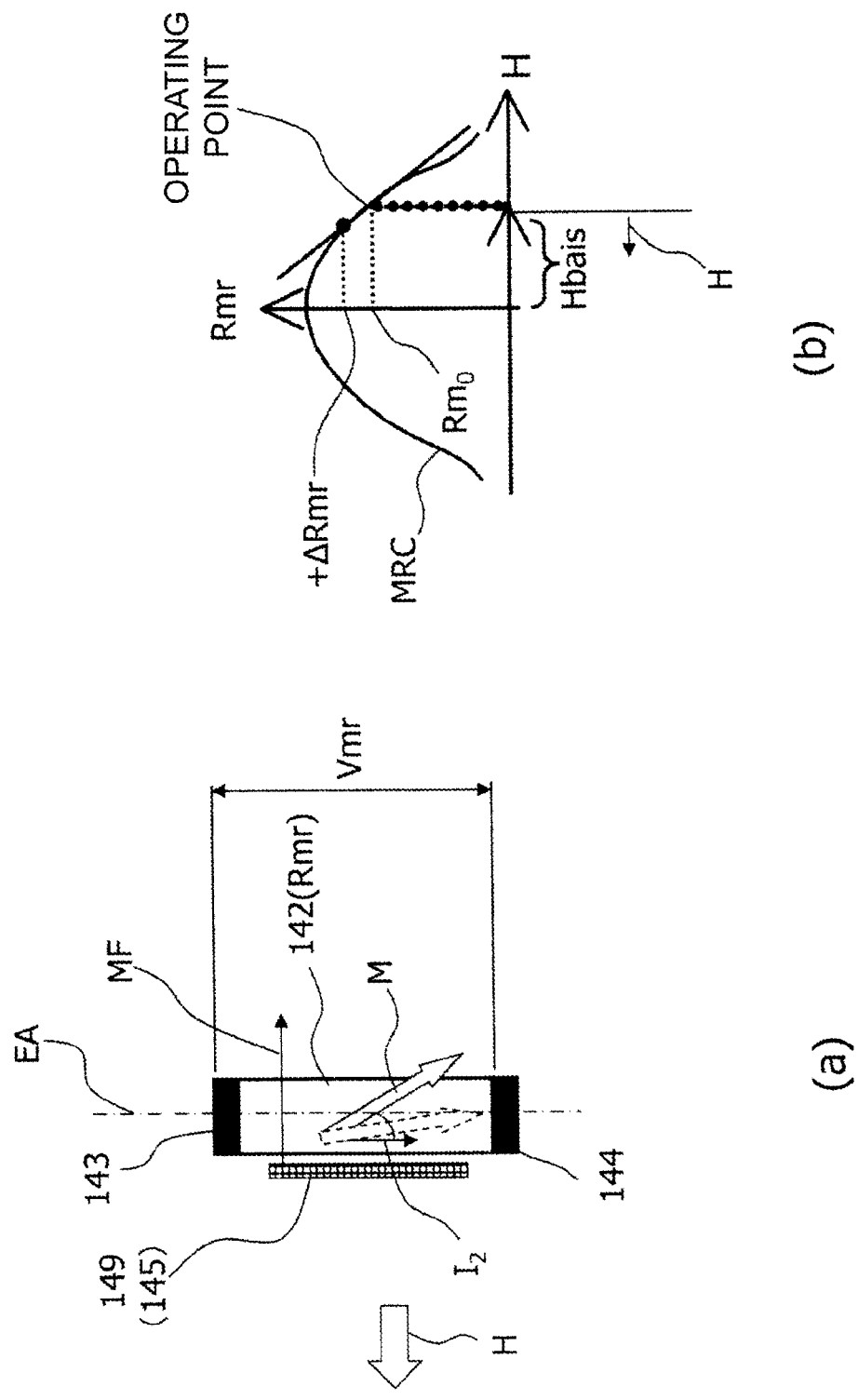
FIGS. 3(a) and 3(b) are explanatory views of the operation of the magnetic element.

FIG. 3(a) illustrates a plan view of the magnetic element 14 in FIG. 2. FIG. 3(b) illustrates the relationship between the external magnetic field H applied to the magnetic element 14 and a resistance value Rmr of the magnetic film 142. The external magnetic field H applied to the magnetic film 142 is shown on the horizontal axis, and the resistance value (Ω) of the magnetic film 142 is shown on the vertical axis. It is considered that the difference between the direction of the current $I_2$ and that of the magnetization M causes the magneto-resistance effect. Thus, the resistance value of the magnetic film due to the applied external magnetic field H can be expressed as an even function.

However, when the external magnetic field H is applied from a state where the external magnetic field H is an intensity of zero, it is impossible to identify the direction of the external magnetic field H as the variation in the resistance value. In light of the foregoing, a bias magnetic field MF is applied in a direction perpendicular to the longitudinal direction. The bias magnetic field MF moves the operating point. Thus, the resistance value Rmr increases or decreases depending on the direction of the external magnetic field H. FIG. 3(b) illustrates that the external magnetic field H is applied when the resistance value is $Rm_0$ on the operating point, resulting in the variation of the resistance by +ΔRmr. Note that a reference sign MRC is a curve indicating the magneto-resistance effect.

A permanent magnet 149 can readily provides the bias magnetic field MF. Needless to say, the permanent magnet 149 can be an electric magnet. A material configured to provide the bias magnetic field MF to the magnetic element 14 as described above is referred to as a bias means 145. The bias means 145 is not necessarily a material that directly generates a magnetic field.

Figure 4:
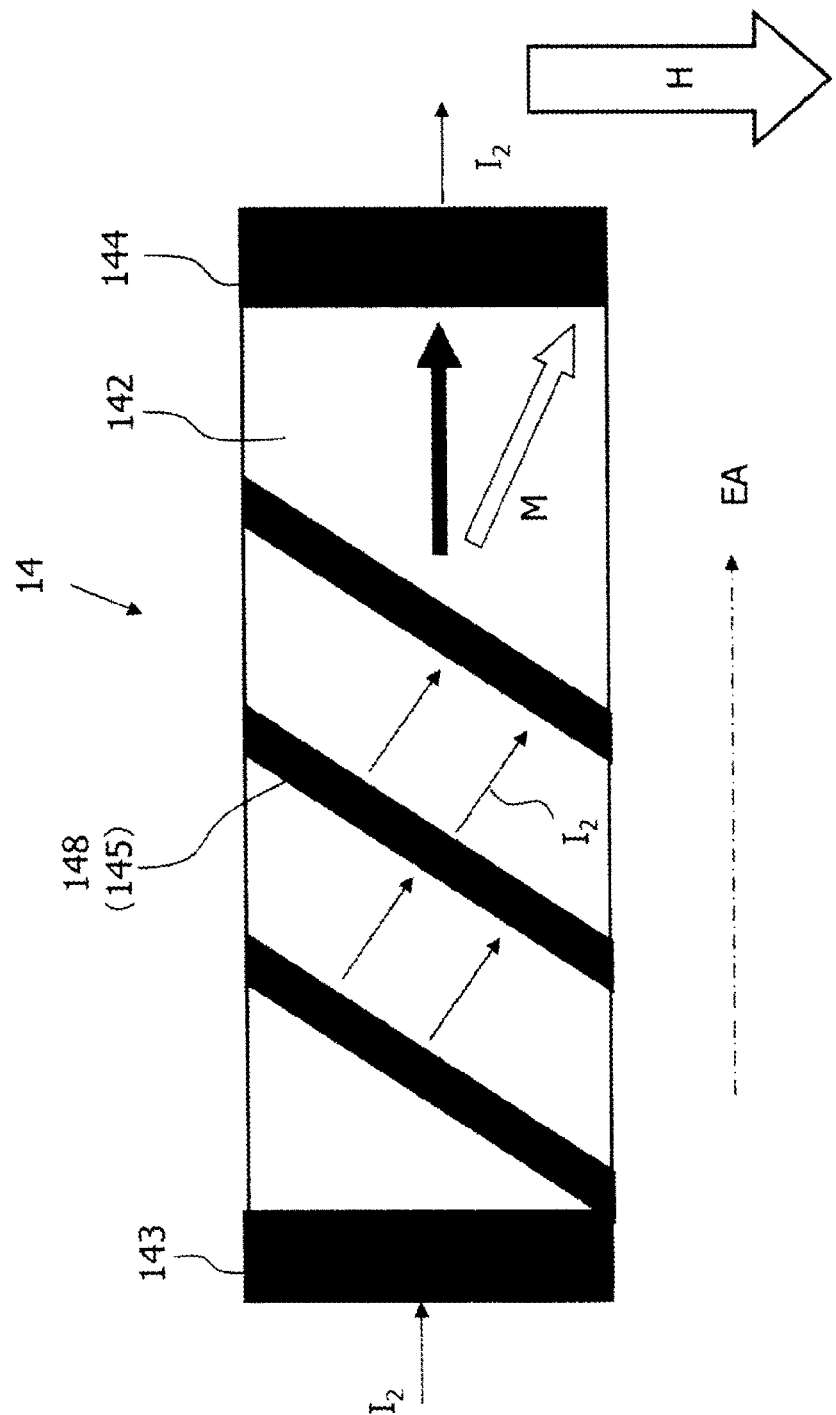
FIG. 4 is a view of a (barber-pole) magnetic element with a stripe conductor pattern.

FIG. 4 illustrates conductors 148 that are made of a highly conductive material, and are formed into a band-shaped stripe structure on the magnetic film 142. In the stripe structure, the conductor 148 is formed into a band and inclined to the longitudinal direction of the magnetic film 142. In such a structure, the current $I_2$ flows between the conductors 148 in a direction perpendicular to each band conductor 148. Additionally, the magnetization easy axis EA is induced on the magnetic film 142 in the longitudinal direction of the magnetic element 14. This causes the direction of the magnetization M to differ from the direction of the current $I_2$ even when the external magnetic field H has an intensity of zero. In other words, with regard to the magneto-resistance effect, it is possible to obtain a condition where the bias magnetic field is applied.

It is assumed that the external magnetic field H (a white arrow H) is applied to the magnetic element 14 having the structure described above from the upper side to the lower side of the drawing paper. The external magnetic field H rotates the magnetization M (a black arrow), which has been in a different direction from the current $I_2$ without the external magnetic field H, to the same direction as the current $I_2$. This varies the resistance value as illustrated in FIG. 3(b).

As described above, the bias means 145 herein includes a material that has the same effect as when the magnetic field is actually applied even if the material does not actually generate the magnetic field. The magnetic element 14 having the structure illustrated in FIG. 4 is referred to as a barber-pole magnetic element. As another example, the magnetization easy axis EA introduced on the magnetic film 142 can be inclined from the longitudinal direction. This is because the direction in which the current originally flows (the longitudinal direction) is different from the direction of the magnetization even in such a case.

Figure 5:
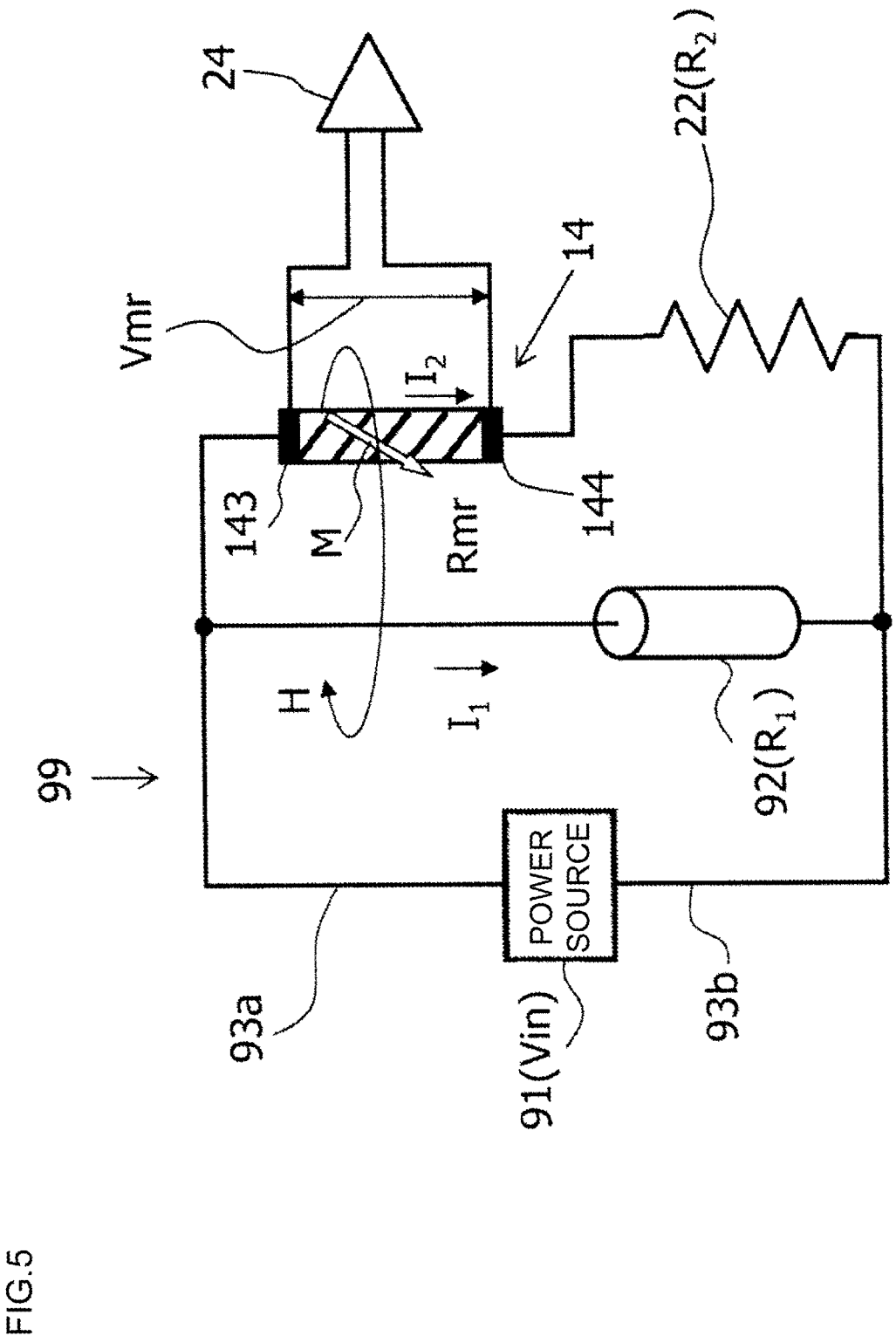
FIG. 5 is an explanatory view of the principle of electric power measurement using the magnetic element.

FIG. 5 illustrates the principle for an electric power meter using the barber-pole magnetic element 14. The magnetic element 14 and the measuring resistance 22 are connected in series and are connected parallel to the load 92 connected to the power source 91 of a to-be-measured circuit 99. The magnetic element 14 is placed next to and parallel to the electric wire A93a connecting the power source 91 to the load 92. In that case, the measuring resistance 22 has a value sufficiently larger than the resistance value Rmr of the magnetic element 14. Meanwhile, the electric wire A93a has a sufficiently small resistance.

First, the external magnetic field H applied to the magnetic element 14 is expressed an expression (1) if the power source 91 is a direct-current power source, the current flowing in the electric wire A93a and the electric wire B93b is $I_1$, and the proportionality constant is α.

$$H = \alpha I_1 \quad (1)$$

As illustrated also in FIG. 3(b), the variation ΔRmr in the electric resistance of the magnetic element 14 is proportional to the magnetic field H applied from the outside. The variation can be expressed as an expression (2) if the proportionality constant is β in consideration of the expression (1).

$$\Delta Rmr = \beta H = \beta(\alpha I_1) \quad (2)$$

An electric resistance $R_m$ of the entire magnetic element 14 when the external magnetic field H is applied is expressed as an expression (3) if the electric resistance (on the operating point) is $R_{m0}$ with no external magnetic field H applied to the magnetic film 142.

$$R_m = R_{m0} + \Delta R_{mr} = R_{m0} + \alpha\beta I_1 \quad (3)$$

In other words, the magnetic film 142, which is placed next to the electric wire A93a in which the current $I_1$ flows, has the electric resistance characteristic expressed in the expression (3). A voltage Vmr between the element terminals 143 and 144 of the magnetic element 14 is expressed as an expression (4) when the current $I_2$ flows between the element terminals 143 and 144.

$$V_{mr} = R_m I_2 = (R_{m0} + \Delta R_m)I_2 = (R_{m0} + \alpha\beta I_1)I_2 \quad (4)$$

Next, an expression (5) holds when a voltage $V_{in}$ is $V_1$. This is because the power source 91 is a direct-current power source. Meanwhile, the resistance of the electric wire A93a and electric wire B93b is sufficiently small and the electric resistance $R_m$ of the magnetic element 14 is also sufficiently smaller than the measuring resistance 22 (the value is $R_2$). The current $I_1$ flowing in the electric wire A93a and the current $I_2$ flowing in the magnetic element 14 are expressed as an expression (6) and an expression (7), respectively, if the resistance of the load 92 is $R_1$.

Consequently, voltage Vmr between the element terminals 143 and 144 of the magnetic element 14 is expressed as an expression (8). Note that the relationship of $R_{m0} \ll R_2$ is used in the middle of the deformation in the expression (8). Additionally, $K_1$ is the proportionality constant. In other words, a voltage proportional to an electric power $I_1 V_1$ consumed in the load 92 can be obtained between the element terminals 143 and 144 of the magnetic elements 14.

[Mathematical Formula 1]

$$V_{in} = V_1 \quad (5)$$

$$I_1 = \frac{V_1}{R_1} \quad (6)$$

$$I_2 = \frac{V_1}{R_2} \quad (7)$$

$$V_{mr} = (R_{m0} + \alpha\beta I_1)I_2 \quad (8)$$
$$= \left(R_{m0} + \alpha\beta\frac{V_1}{R_1}\right)\frac{V_1}{R_2}$$
$$= \frac{R_{m0}V_1}{R_2} + \alpha\beta\frac{V_1}{R_1}\frac{V_1}{R_2}$$
$$\cong K_1 I_1 V_1$$

The relationships described above hold even when the power source 91 is an alternating-current power source. Next, a case in which the power source 91 is an alternating-current power source and the load 92 has reactance will be described. The relationships in the expression (1) to the expression (4) are described above. The power source 91 is an alternating-current power source. Thus, the voltage $V_{in}$ is expressed as an expression (9) if the amplitude is $V_1$ and the angular frequency is ω. The load 92 has reactance in the to-be-measured circuit 99. This causes a phase shift between the current $I_1$ flowing in the load 92 and the voltage $V_{in}$ in the power source 91. The phase shift is denoted with θ. On the other hand, the magnetic element 14 is in phase with the voltage $V_{in}$ in the power source 91 because the magnetic element 14 has a normal resistance. Consequently, the currents $I_1$ and $I_2$ are expressed as expressions (10) and (11), respectively.

Substituting the expressions (10) and (11) into the expression (4) deforms the expression (4) as an expression (12).

[Mathematical Formula 2]

$$V_{in} = V_1 \sin\omega t \quad (9)$$

$$I_1 = \frac{V_1}{R_1}\sin(\omega t - \theta) \quad (10)$$

$$I_2 = \frac{V_1}{R_2}\sin\omega t \quad (11)$$

$$V_{mr} = (R_{m0} + \alpha\beta I_1)I_2 \quad (12)$$
$$= \left(R_{m0} + \alpha\beta\frac{V_1}{R_1}\sin(\omega t - \theta)\right)\frac{V_1}{R_2}\sin\omega t$$
$$= \frac{R_{m0}V_1}{R_2}\sin\omega t + \alpha\beta\frac{V_1}{R_1}\sin(\omega t - \theta)\frac{V_1}{R_2}\sin\omega t$$
$$= \frac{R_{m0}V_1}{R_2}\sin\omega t + \alpha\beta\frac{V_1}{R_1}\frac{V_1}{R_2}\frac{1}{2}\{\cos\theta - \cos(2\omega t - \theta)\}$$
$$= \frac{R_{m0}V_1}{R_2}\sin\omega t - \alpha\beta\frac{V_1}{R_1}\frac{V_1}{R_2}\frac{1}{2}\cos(2\omega t - \theta) +$$
$$\alpha\beta\frac{V_1}{R_1}\frac{V_1}{R_2}\frac{1}{2}\cos\theta$$
$$= \text{AC component} + K_2 I_1 V_1 \cos\theta$$

With reference to the expression (12), the last term expresses that the effective electric power consumed in the load 92 is a direct-current component. In other words, the direct-current voltage obtained by passing the output between the element terminals 143 and 144 through a low-pass filter is proportional to the effective electric power consumed in the load 92. Depending on the method of connecting the magnetic element 14, not only the current flowing in the power source lines 93 but also the electric power consumed in the load 92 connected to the power source can be measured using the magnetic element 14 as described above.

Figure 6:
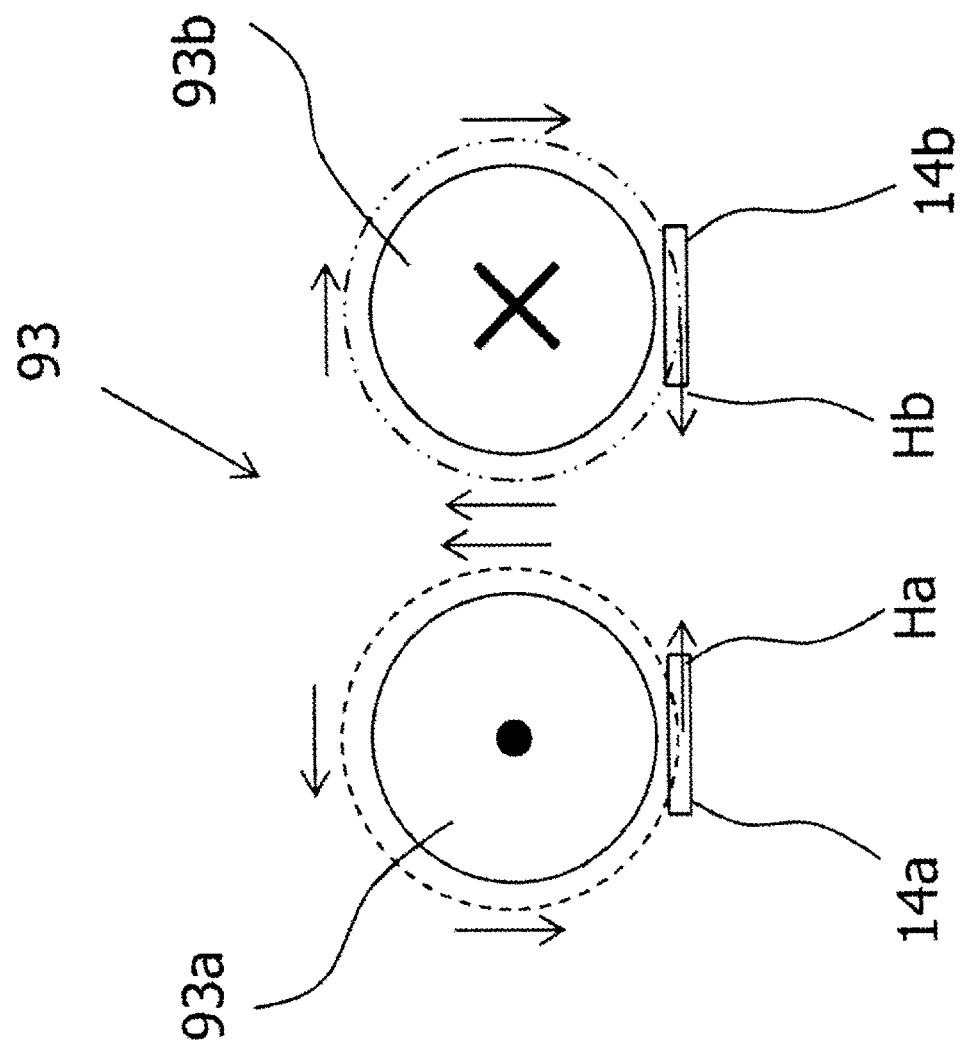
FIG. 6 is a cross-sectional view of the electric leakage detecting apparatus according to the present invention, taken along a plane perpendicular to the power source lines.

Based on the preparation described above, the electric leakage detecting apparatus 1 in FIG. 1 will further be described. FIG. 6 is a schematic cross-sectional view of the magnetic elements 14 placed along the electric wires A93a and B93b of the power source lines 93. The electric wire A93a is on the left side and the electric wire B93b is on the right side. The magnetic element 14 placed on the electric wire A93a is defined as a magnetic element A14a and the magnetic element 14 placed on the electric wire B93b is defined as the magnetic element B14b. The power source lines 93 connect the power source 91 and the load 92 (see FIGS. 1(a) and 1(b)). Thus, the currents flow necessarily in the opposite directions in the right and left power source lines. Consequently, it is assumed that the current in the left electric wire A93a flows from the rear surface to the front surface of the drawing paper, and that the current in the right electric wire B93b flows from the front surface to the rear surface of the drawing paper.

At that time, magnetic fields arise around the electric wires. The magnetic field around the electric wire A93a arises in the counterclockwise (the dashed line) on the drawing paper. The magnetic field around the electric wire B93b arises in the clockwise (the alternate long and two short dashes line) on the drawing paper. Then, a magnetic field Ha is applied to the magnetic element A14a from the left side to the right side of the drawing paper, and a magnetic field Hb is applied to the magnetic element B14b from the right side to the left side of the drawing paper. This means that the magnetic fields are applied from the outside of the magnetic film in a direction which is an in-plane direction of the magnetic film 142 and is perpendicular to the longitudinal directions of the magnetic elements 14.

Note that, in that case, the two magnetic elements A14a and B14b are configured to have the same magneto-resistance effect when the same magnetic fields are applied to the two magnetic elements. Manufacturing the magnetic elements such that the magnetic films 142 have the same dimensions in thickness, length, and width, and the same composition under the same manufacturing conditions can provide the same magneto-resistance effect to the magnetic elements 14.

Furthermore, the intensity of the magnetic field applied to each of the magnetic elements 14 at that time is inversely proportional to the square of the distance from each of the electric wires A93a and B93b to each of the magnetic elements A14a and B14b. Thus, the two magnetic elements A14a and B14b have the same resistance value if the magnetic elements are placed at the same distances away from the electric wires A93a and B93b, respectively, and no current leaks. This is because the same current flows in the electric wires A93a and B93b.

On the other hand, when the current leaks from the circuit formed of the power source 91 and the load 92 (the to-be-detected circuit 90), the current flowing in the electric wire A93a from the power source 91 to the load 92 differs from the current returning through the electric wire B93b from the load 92 to the power source 91. Concretely, the current flowing in the electric wire A93a is not the same as the current flowing in the electric wire B93b in FIG. 6. Thus, the resistance value of the magnetic element A14a differs from the resistance value of the magnetic element B14b.

Consequently, by configuring a circuit, as the electric leakage detecting apparatus, to output the difference between the resistance value of the magnetic element A14a and the resistance value of the magnetic element B14b, it is possible to determine that no current leaks have occurred when the difference between the resistance values of the magnetic element A14a and B14b is zero, and that the current leaks have occurred when a difference having a predetermined value or more is detected.

Note that the placement of the magnetic element A14a and the magnetic element B14b is not especially limited as long as the magnetic element A14a and the magnetic element B14b are placed at the same distances away from the electric wire A93a and the electric wire B93b that are adjacently placed, respectively. In FIG. 6, the magnetic element A14a and the magnetic element B14b are placed on the same plane.

Figure 7:
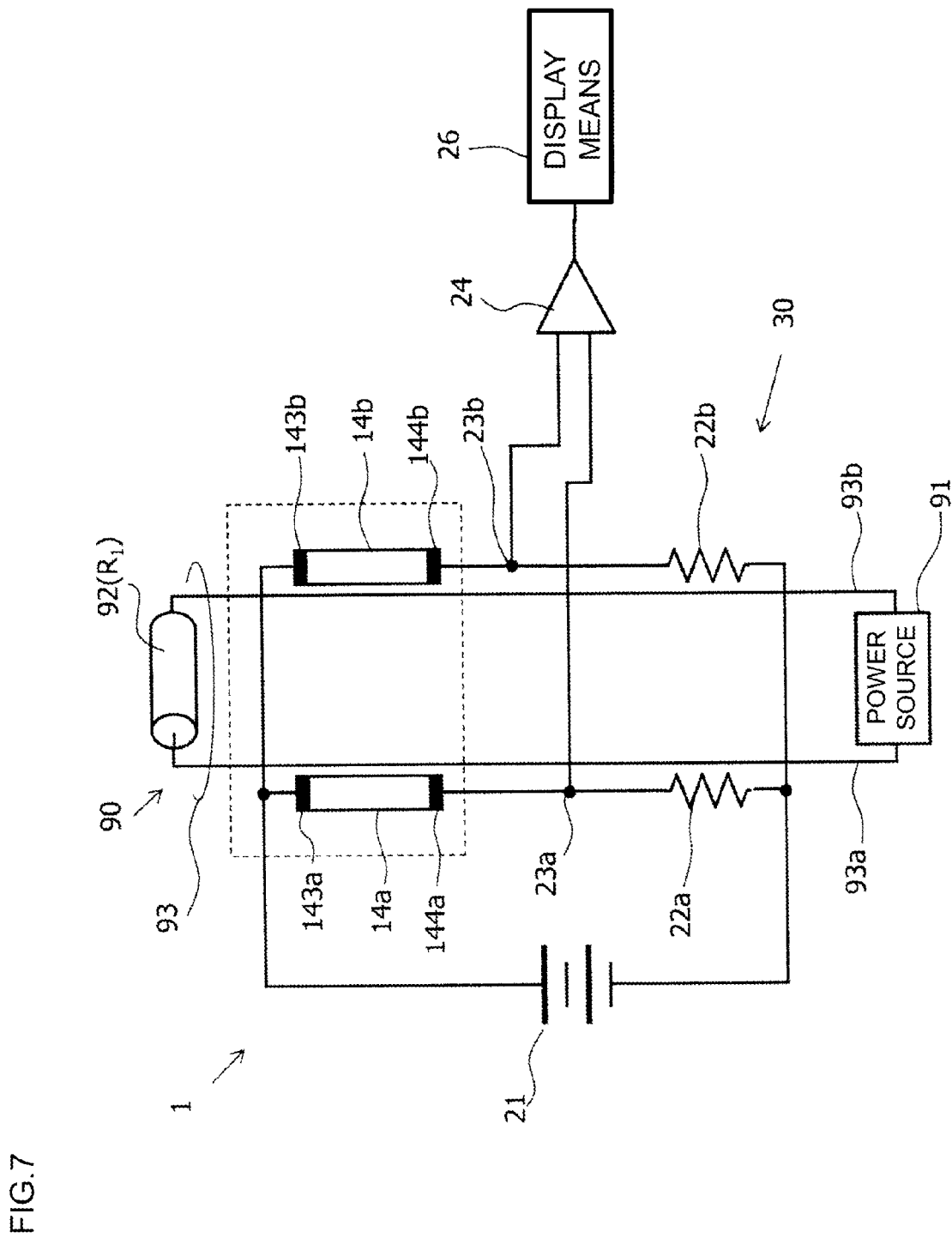
FIG. 7 is a view of the wire connection of the electric leakage detecting apparatus according to the present invention (with an independent power source).

FIG. 7 is a view of the wire connection when the electric leakage detecting apparatus 1 according to the present embodiment is installed on the to-be-detected circuit 90 formed of the power source 91 and the load 92. The power source 91 can be an alternating-current power source or a direct-current power source. Additionally, the load 92 can have either impedance without complex numbers or reactance with complex numbers. The two power source lines 93, which extend from the power source 91, are referred to as the electric wire A93a and the electric wire B93b. A part of each of the electric wires A93a and B93b is held with each of the holders 11 illustrated in FIGS. 1(a) and 1(b).

Each of the electric wires A93a and B93b is preferably held at a part as close to the power source 91 as possible.

This is because an electric leakage may fail to be detected unfortunately in a direct-current power source 91 if the current leaks from a part nearer to the power source 91 than the position at which the detection have occurred, whereas an electric leakage can be detected at any position on the electric wires A93a and B93b in an alternating-current power source 91.

The part held with the holders 11 is surrounded with a dashed line in FIG. 7. The electric wire A93a is adjacent to the magnetic element A14a, and the electric wire B93b is adjacent to the magnetic element B14b at the part. A first terminal element 143a of the magnetic element A14a is connected to a first terminal element 143b of the magnetic element B14b. A first terminal of the measuring resistance A22a is connected to a second terminal element 144a of the magnetic element A14a in series. A first terminal of the measuring resistance B22b is connected to a second terminal element 144b of the magnetic element B14b in series.

Second terminals of the measuring resistances A22a and B22b are connected to each other. Furthermore, the magnetic elements A14a and B14b are connected to a first electrode of the detector power source 21, and the second terminals of the measuring resistances A22a and B22b are connected to a second electrode of the detector power source 21. Thus, the magnetic element A14a and the measuring resistance A22a are connected to each other and form a branch. The magnetic element B14b and the measuring resistance B22b are connected to each other and form a branch. Connecting the two branches in parallel forms a bridge circuit 30.

The detector power source 21, which feeds a drive current to the magnetic elements A14a and B14b, is a driving means. In FIG. 7, the detector power source 21 and the power source 91 of the to-be-detected circuit 90 are formed as separate circuits. This can be said that the power sources are independent from each other.

The connecting point of the magnetic element A14a and the measuring resistance A22a, and the connecting point of the magnetic element B14b and the measuring resistance B22b are named as measuring terminals 23 (23a and 23b), respectively. The measuring terminals 23 are connected with inputs of the amplifier 24 so as to amplify the voltage between the measuring terminals 23. The display means 26 is connected to the output from the amplifier 24. The display means 26 is not especially limited to as long as the display means 26 can display the output from the amplifier 24. For example, the display means 26 can display the output from the amplifier 24 without any change. Alternatively, a threshold used to round off predetermined noise levels can be provided such that the display means 26 can display a signal indicating the presence of an electric leakage when the output from the amplifier 24 is higher than the threshold.

Note that the detecting means 20 includes the detector power source 21 that is a driving means, the measuring resistances 22a and 22b, the amplifier 24, and the display means 26. When the power source 91 of the to-be-detected circuit 90 is also used as the driving means as described below, the detecting means does not include a driving means.

Next, the operation of the electric leakage detecting apparatus 1 will be described. When no current leaks in the to-be-detected circuit 90 including the power source 91 and the load 92, the same current flows in the electric wire A93a and the electric wire B93b. At that time, the resistance values of the magnetic element A14a and magnetic element B14b affected by the magneto-resistance effects are the same. Thus, the voltages are the same on the measuring terminals 23a and 23b in the bridge circuit 30 including the magnetic element A14a, the measuring resistance A22a, the magnetic element B14b, and the measuring resistance B22b. Consequently, the output from the amplifier 24 is zero.

On the other hand, when the current leaks from the to-be-detected circuit 90 including the power source 91 and the load 92, the current flowing in the electric wire A93a is not the same as the current flowing in the electric wire B93b. Consequently, the electric resistance of the magnetic element A14a has a value different from the electric resistance of the magnetic element B14b. In other words, the voltage difference corresponding to the difference of the electric resistances between the magnetic element A14a and the magnetic element B14b arises between the measuring terminals 23a and 23b. The voltage difference is amplified with the amplifier 24 and is displayed on the display means 26.

Note that, in the case of the electric leakage, the output from the amplifier 24 is a direct-current output if the power source 91 is a direct-current power source. Alternatively, if the power source 91 is an alternating-current power source, the output from the amplifier 24 is also an alternating-current output. Thus, when the power source 91 is an alternating-current power source, a rectifier (not illustrated in the drawings) can be placed between the amplifier 24 and the display means 26.

The detector power source 21 is independent from the to-be-detected circuit 90 in the electric leakage detecting apparatus 1 according to the present embodiment. Thus, only fixing the electric wire A93a and electric wire B93b in the already-formed to-be-detected circuit 90 with the holders 11 can install the electric leakage detecting apparatus 1 on the detected circuit. Additionally, the difference between the measuring terminals 23a and 23b is amplified with the amplifier 24. Thus, an electric leakage can be detected even when the voltage of the detector power source 21 drops. However, the drop in the electric power supplied to the amplifier 24 sometimes may reduce the voltage output from the amplifier 24.

Note that each of the magnetic elements A14a and B14b does not necessarily include the bias means 145 in the electric leakage detecting apparatus 1 according to the present embodiment. It is only required to find the difference between the magneto-resistance effects on the magnetic element A14a and B14b by monitoring the voltages on the measuring terminals 23a and 23b in the bridge circuit 30. Needless to say, the magnetic elements A14a and B14b each can be magnetic elements 14 including a bias means 145. In other words, the electric leakage detecting apparatus 1 according to the present embodiment detects the difference between the currents flowing in the electric wire A93a and electric wire B93b.

Second Embodiment

Figure 8:
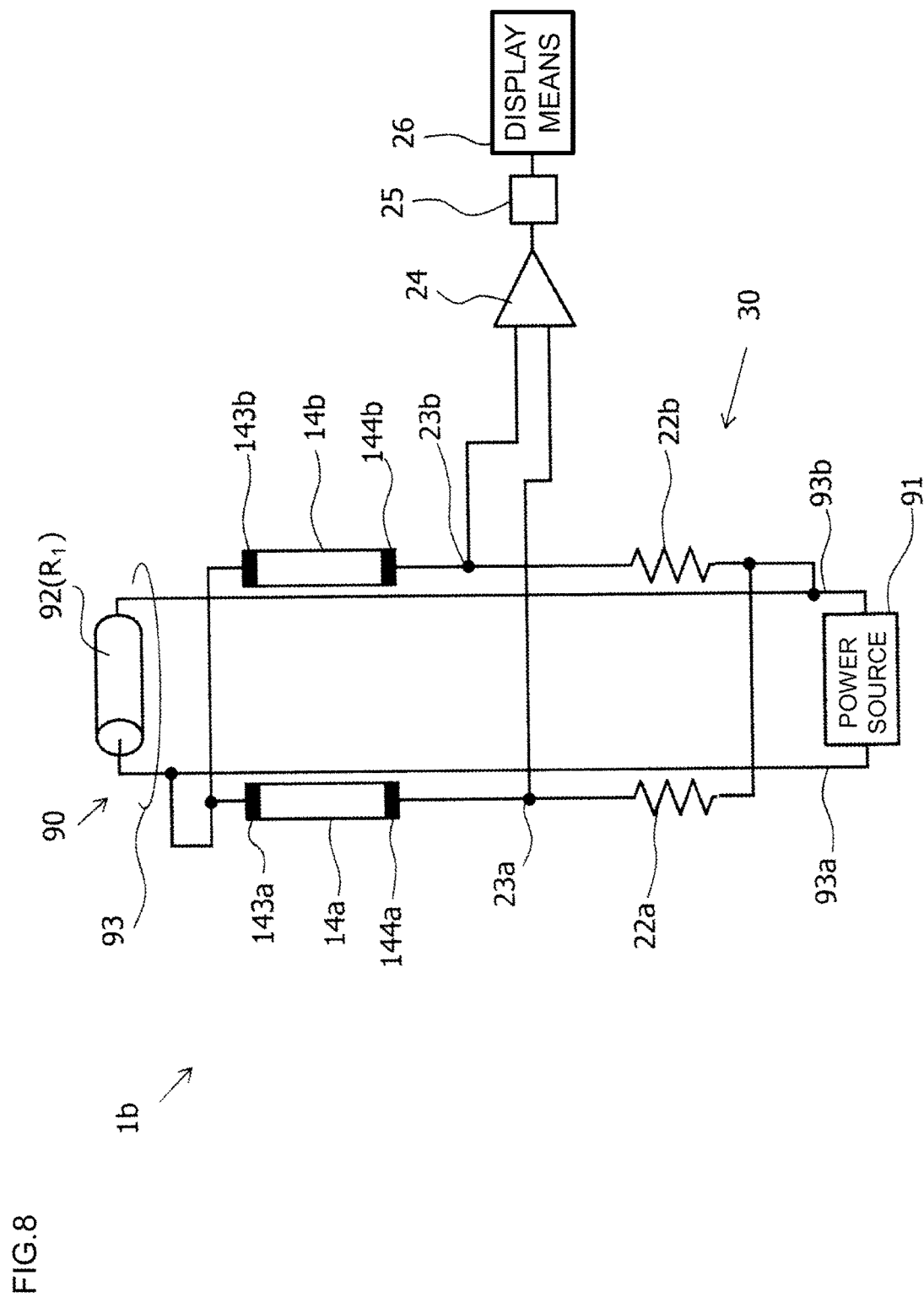
FIG. 8 is a view of the wire connection of the electric leakage detecting apparatus according to the present invention (with a parasite power source).

FIG. 8 illustrates the wire connection when an electric leakage detecting apparatus 1b according to the present embodiment is installed on a to-be-detected circuit 90. Electric wires A93a and B93b are held in the same manner as in FIGS. 1(a) and 1(b). In the present embodiment, a power source 91 of the to-be-detected circuit 90 is used also as the power source for a bridge circuit 30, namely, as the detector power source.

Similarly to the embodiment 1, a magnetic element A14a, a measuring resistance A22a, a magnetic element B14b, and a measuring resistance B22b form the bridge circuit 30. Current is supplied to the bridge circuit 30 through a circuit of which first end is connected to the electric wire A93a and of which second end is connected to the electric wire B93b. In other words, the driving means is the power source 91 of the to-be-detected circuit 90. Such a configuration is described as that the detector power source is parasite in the to-be-detected circuit 90.

In the electric leakage detecting apparatus 1b according to the present embodiment, the magnetic element A14a and the measuring resistance A22a are connected to the power source 91 of the to-be-detected circuit 90 parallel to the load 92. In other words, the voltage between element terminals 143a and 144a of the magnetic element A14a provides an output proportional to the electric power consumed in the load 92. The magnetic element B14b and the measuring resistance B22b are also connected to the power source 91 of the to-be-detected circuit 90 parallel to the load 92. Thus, the voltage between both ends of the magnetic element B14b also provides an output proportional to the electric power consumed in the load 92. In other words, what is monitored between the measuring terminals 23a and 23b is equivalent to the difference between the consumed power value in the load 92 measured on the electric wire A93a and the consumed power value in the load 92 measured on the electric wire B93b. Both of the values are obtained from the same electric power consumed in the load 92.

When no current leaks from the to-be-detected circuit 90, the power consumed in the load 92 seen from the power source 91 measured on the electric wire A93a is the same as that measured on the electric wire B93b. On the other hand, when the current leaks from the to-be-detected circuit 90, the power consumed in the load 92 measured on the electric wire A93a is different from that measured on the electric wire B93b. Consequently, the difference of the voltages on the measuring terminals 23a and 23b is not zero. The voltage difference between the measuring terminals 23a and 23b is generated, which causes the amplifier 24 to provide the output voltage proportional to the voltage between the measuring terminals 23a and 23b.

As a result, the electric leakage can be confirmed on the display means 26. The electric leakage detecting apparatus 1b in the present embodiment detects the electric power consumed in the load 92 as described above. Note that it is preferable that the electric leakage detecting apparatus 1b be previously embedded in the to-be-detected circuit 90 because the electric leakage detecting apparatus 1b uses the power source 91 of the to-be-detected circuit 90 as the driving means.

In the detection of the electric leakage, when the power source 91 is a direct-current power source, the output from the amplifier 24 is a direct-current output. When the power source 91 is an alternating-current power source, the output from the amplifier 24 is an alternating-current output. When the power source 91 is an alternating-current power source, it is only required to monitor the direct-current components in the output from the amplifier 24. Thus, when the power source 91 is an alternating-current power source, placing a low-pass filter between the amplifier 24 and the display means 26 enables the display means 26 to receive the direct-current output.

Third Embodiment

Figure 9:
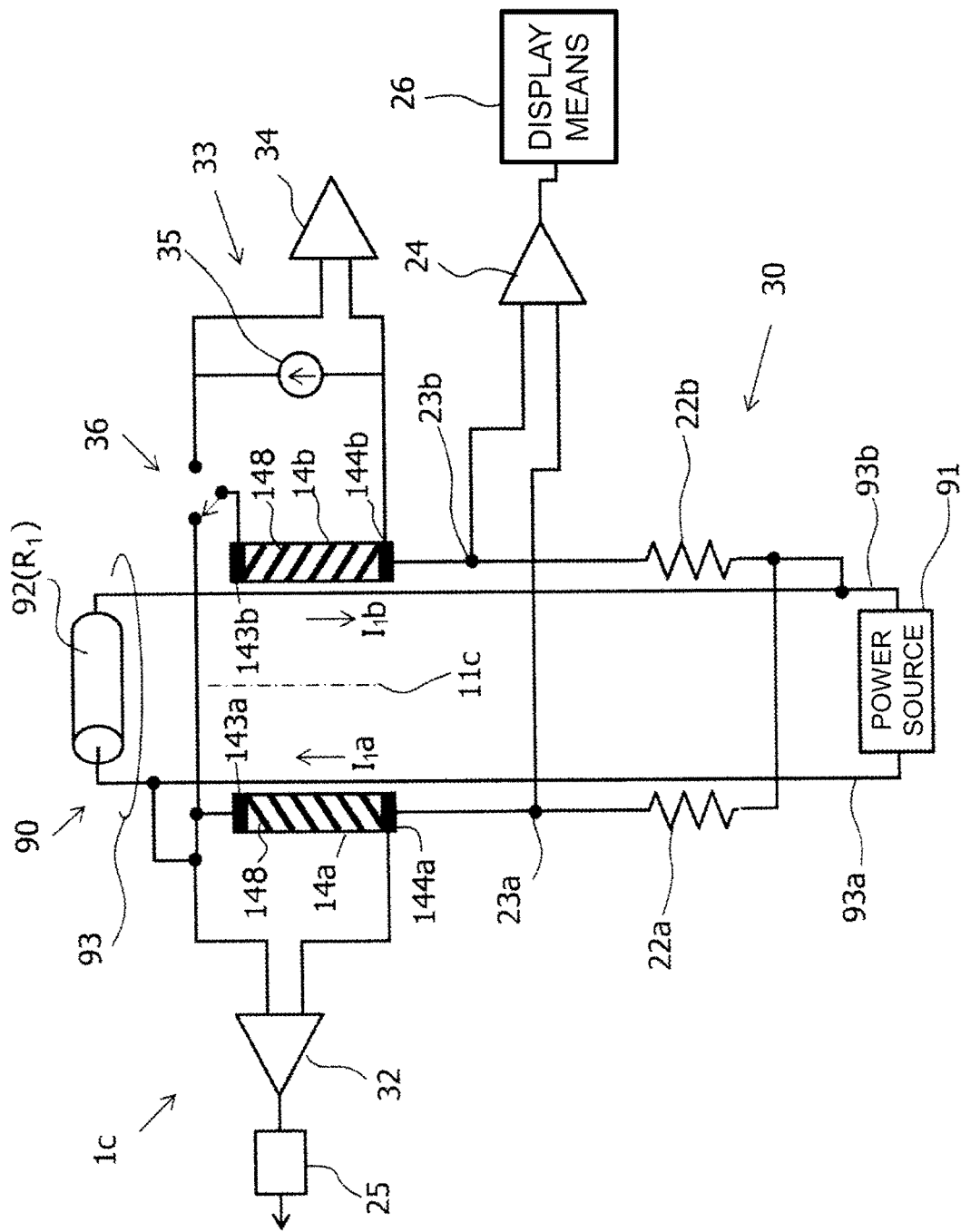
FIG. 9 is a view of the wire connection of the electric leakage detecting apparatus according to the present invention and capable of measuring electric power and measuring electric current.

FIG. 9 illustrates the wire connection when an electric leakage detecting apparatus 1c according to the present embodiment is installed on a to-be-detected circuit 90. Power source lines 93 are held and fixed in the same manner as in FIGS. 1(a) and 1(b). Additionally, the method of installing the electric leakage detecting apparatus 1c on the to-be-detected circuit 90 is the same as in the second embodiment. In other words, the power source 91 of the to-be-detected circuit 90 is used also as the driving means for the bridge circuit 30.

The difference between the present embodiment and the second embodiment is that the present embodiment uses barber-pole magnetic elements as magnetic elements 14, and that the present embodiment is provided with a power detecting amplifier 32, and that a terminal element 143b of the magnetic element B14b includes a switch 36, the power detecting amplifier 32 being configured to output the voltage between the element terminals 143a and 144a of a first magnetic element A14a, the switch 36 being configured to switch whether the terminal element 143b is connected to the to-be-detected circuit 90 or independent to be connected to a circuit 33 in which current flows from a constant current source 35 which is different from the power source 91 of the to-be-detected circuit 90. A current detecting amplifier 34 is connected to the circuit 33 parallel to the constant-current power source 35.

Barber-pole magnetic elements are used as the magnetic elements 14 in order to cause the electric leakage detecting apparatus to also work as a current sensor and an electric power sensor using at least one of the barber-pole magnetic elements 14 utilizing the bias means 145 structurally included in the barber-pole magnetic elements. Thus, a bias means 145 other than the bias means included in the barber-pole magnetic element can also be used.

To use the electric leakage detecting apparatus as an electric leakage detecting apparatus, the switch 36 is switched such that first terminals 143a and 143b of the two magnetic elements A14a and B14b are connected to the to-be-detected circuit 90. When no current leaks, the voltage difference between the measuring terminals 23a and 23b in the bridge circuit 30 is zero. When the current leaks, a predetermined pressure arises between the measuring terminals 23a and 23b. This is the same as in the second embodiment.

In that case, the bias means 145 are provided to the magnetic elements A14a and B14b in the opposite directions to each other. In other words, the conductor patterns in the magnetic elements A14a and B14b are inclined in the different directions. Concretely, each of the bias means 145 is provided so as to give a bias magnetic field extending toward the center 11c between the holders 11a and 11b in FIGS. 1(a) and 1(b) or a bias magnetic field extending from the center between the holders 11a and 11b toward both outer sides. The conductors 148 that have a stripe structure and that are the bias means 145 of the magnetic elements A14a and B14b are inclined to the center 11c in such barber-pole magnetic elements in FIG. 9. Since a current $I_1a$ flows in the electric wire A93a in the opposite direction to the direction in which a current $I_1b$ flows in the electric wires B93b, the same magneto-resistance effects is generated when the currents flow in the opposite directions to each other.

The generation of the same magneto-resistance effects means that the magnetic elements A14a and B14b vary in the same direction from the operating point on the curve MRC indicating the magneto-resistance effect (see FIG. 3(b)). In FIG. 9, the magnetic field caused by each of the currents $I_1a$ and $I_1b$ changes the direction of the magnetization in each of the magnetic elements A14a and B14b to the direction away from the direction in which the current flows in the magnetic film.

In the configuration described above, the currents $I_1a$ and $I_1b$ having the same value reduce both of the resistance values of the magnetic elements A14a and B14b from the resistance values on the operating point. Additionally, when the magnetic elements A14a and B14b have the magneto-resistance effects showing the same curve MRC, the resistance values are reduced to the same resistance value. Thus, when no current leaks, no voltage arises between the measuring terminals 23a and 23b in the bridge circuit 30.

On the other hand, when the current leaks, the resistance value of one of the magnetic elements 14 varies. This generates a voltage corresponding to the difference between the resistance values of the magnetic elements A14a and B14b between the measuring terminals 23a and 23b in the bridge circuit 30. Amplifying the voltage in the amplifier 24 and displaying the amplified voltage on the display means 26 enable the user to detect the generation of the electric leakage.

The electric leakage detecting apparatus 1c according to the present embodiment can be used not only to detect an electric leakage described above but also as an electric power sensor and a current sensor. Concretely, measuring the voltage between the element terminals 143a and 144a of the magnetic element A14a can find the voltage proportional to the electric power consumed in the load 92 of the to-be-detected circuit 90 from the power detecting amplifier 32. Note that, when an alternating current flows in the to-be-detected circuit 90, the power detecting amplifier 32 can provide the voltage output of which direct-current component is proportional to the effective electric power consumed in the load. To extract the direct-current component, for example, a low-pass filter 25 may be connected to the output from the amplifier 24.

By switching the switch 36, a terminal 143b of the magnetic element B14b is connected to the external circuit 33. The switching causes a current to flow to the magnetic element B14b from a constant-current power source 35 that is different from the to-be-detected circuit 90. Then, the voltage between the element terminals 143b and 144b is measured. This can detect the voltage proportional to the current flowing in the to-be-detected circuit 90. When the power source 91 of the to-be-detected circuit 90 is an alternating-current power source, the output of the current detecting amplifier 34 is also an alternating-current output.

As described above, the electric leakage detecting apparatus 1c according to the present embodiment can work also as a current sensor and an electric power sensor using one of the magnetic elements A14a and B14b.

Fourth Embodiment

FIG. 10(a) is a perspective view of a part including holders 11, insertion means 13, and a fixing means 16 in an electric leakage detecting apparatus 2a according to the present embodiment. The holders 11, the insertion means 13, and the fixing means 16 in FIG. 10(a) are similar to the holders 11, the insertion means 13, and the fixing means 12 illustrated in FIGS. 1(a) and 1(b). However, the fixing means 16 includes inclined surfaces 16a1 and 16a2 forming a predetermined angle from a predetermined position 16c of the fixing means toward both ends. In other words, the inclined surface 16a1 and the inclined surface 16a2 abut against each other at an angle 16θ.

Figure 11:
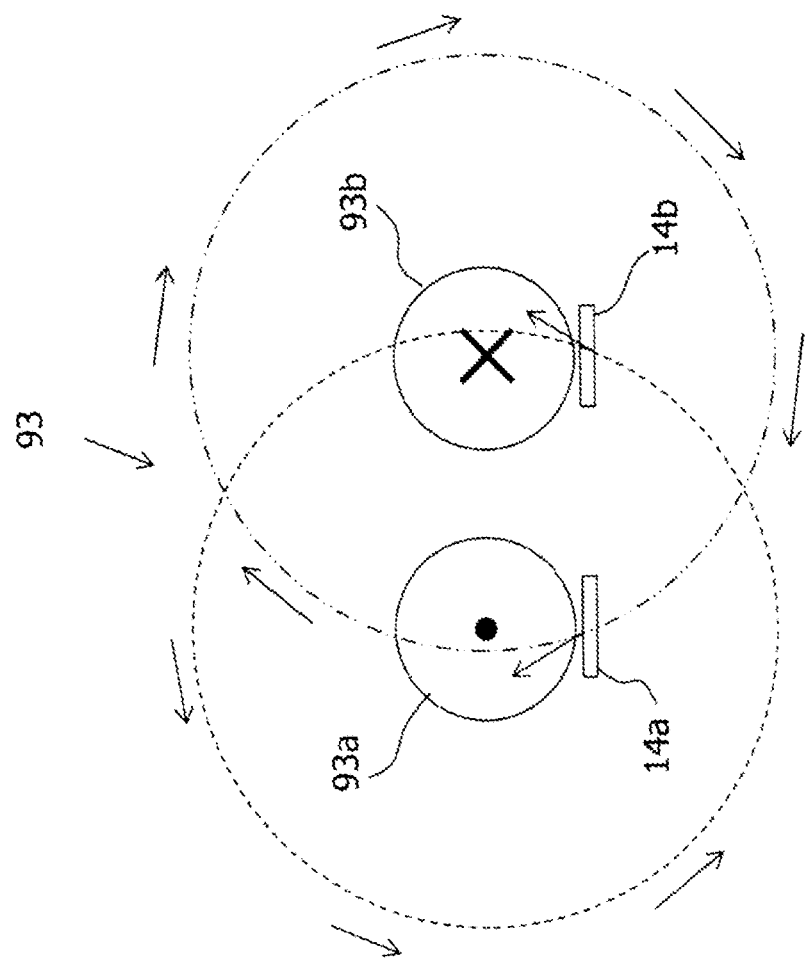
FIG. 11 is a cross-sectional view of the electric leakage detecting apparatus in FIGS. 1(a) and 1(b), taken along a plane perpendicular to the power source lines.

FIG. 11 is a cross-sectional view of power source lines 93. As described above with reference to FIG. 6, the magnetic elements A14a and B14b are affected by the magnetic field generated from the electric wires A93a and B93b, and the magneto-resistance effects change the electric resistances. Considering the magnetic fields further away from the electric wires A93a and B93b, the magnetic field from the electric wire A93a (the dashed line) affects also the magnetic element B14b placed under the electric wire B93b. Similarly, the magnetic field from the electric wire B93b (the alternate long and two short dashes line) affects also the magnetic element A14a placed under the electric wire A93a.

The magnetic fields work so as to reduce the magnetic fields that the magnetic elements A14a and B14b receive from the electric wires A93a and B93b. This leads to the decrease in the sensitivity of the magnetic elements A14a and B14b for detecting an electric leakage.

Figure 10:
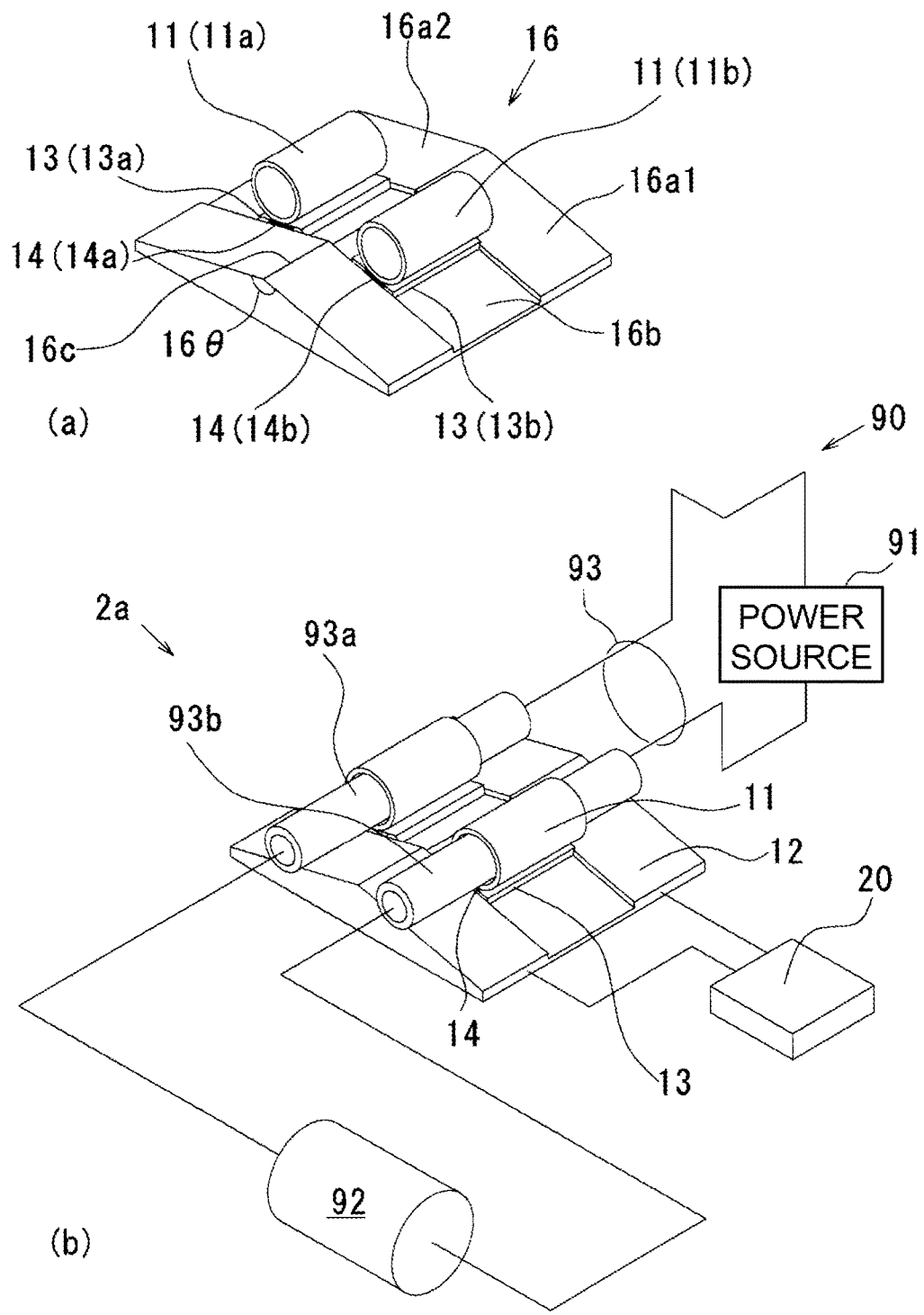
FIGS. 10(a) and 10(b) are the structure of the electric leakage detecting apparatus according to the present invention, and the structure which can reduce the effect of the magnetic field from the adjacent electric wire.
Figure 12:
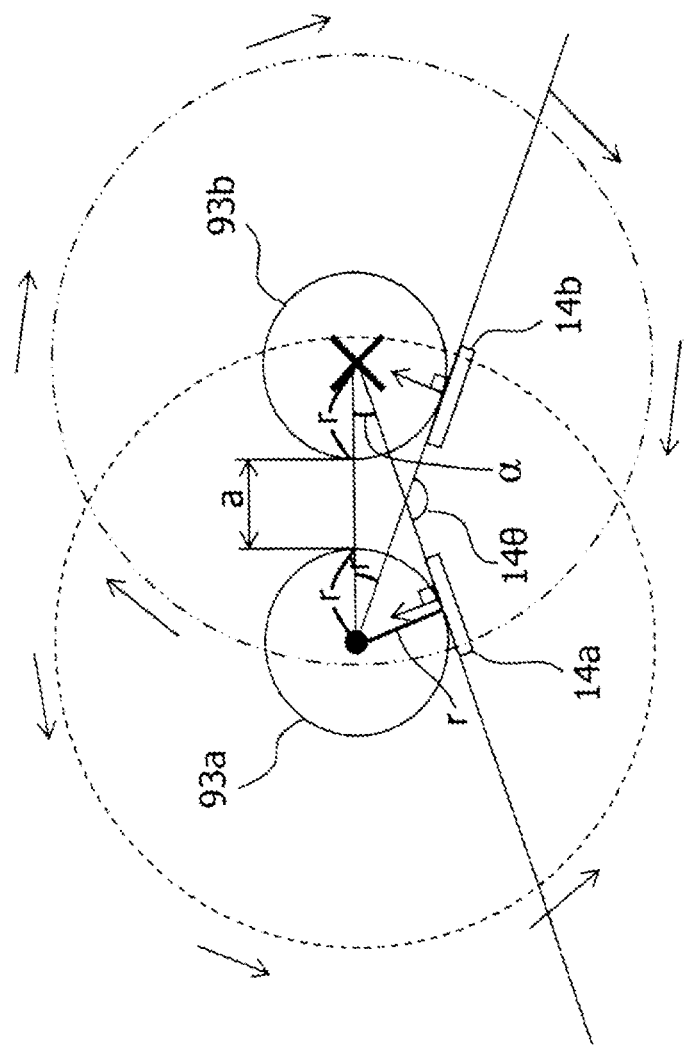
FIG. 12 is a cross-sectional view of the electric leakage detecting apparatus in FIGS. 10(a) and 10(b), taken along a plane perpendicular to the power source lines.

FIG. 12 is a cross-sectional view when the magnetic elements A14a and B14b are inclined at a predetermined angle as illustrated in FIGS. 10(a) and 10 (b). Providing the magnetic elements A14a and B14b each inclined at a predetermined angle to the electric wires A93a and B93b can create the circumstances under which only the components that are perpendicular to the magnetic films of the magnetic elements A14a and B14b in the magnetic fields from the electric wires A93a and B93b are applied to the magnetic elements A14a and B14b. Concretely, the magnetic element A14a is placed on the tangent from the center of the electric wire B93b to the electric wire A93a. The magnetic element B14b is placed on the tangent from the center of the electric wire A93a to the electric wire B93b.

Under such placement, the magnetic field from each of the adjacent electric wires affects the magnetic film of each of the magnetic elements A14a and B14b only in the perpendicular direction. The magnetic film in each of the magnetic elements 14 is much thinner than the magnetic element in width. Thus, the magnetic field in the perpendicular direction to the magnetic film affects the development of the magneto-resistance effect very slightly. Consequently, each of the magnetic elements A14a and B14b exerts the magneto-resistance effect by being affected only by the magnetic field generated from the electric wire A93a or B93b provided on the magnetic element without significantly being affected by the electric wire B93b or A93a adjacent to its own electric wire.

This gives the effects of error reduction and stable operation. Note that the angle 14θ between the magnetic elements A14a and B14b is expressed by an expression (13) with reference to FIG. 12 that is a line diagram. Thus, the angle 14θ formed of the magnetic element A14a and B14b can be an angle 14θ obtained from the expression (13) or an angle near the angle 14θ. Note that "a" denotes the distance between the electric wires B93b and A93a, and "r" denotes the radius of each of the electric wires.

[Mathematical Formula 3]

$$14\theta = \pi - 2\alpha \quad (13)$$
$$\alpha = \arcsin\frac{r}{2r + a}$$

With reference to FIG. 10(a) again, the predetermined angle 16θ between the inclined surfaces 16a1 and 16a2 of the fixing means 16 that abut against each other is the angle formed of the surfaces inclined at the predetermined angle 14θ illustrated in FIG. 12 or at the angle obtained by adjusting the angle 14θ. In other words, the inclined surfaces 16a1 and 16a2 are inclined at a predetermined angle to the midpoint 16c of the holders 11.

FIG. 10 (b) illustrates that the electric wires A93a and B93b in the to-be-detected circuit 90 are held on the part including the holders 11, the fitting means 13, and, the fixing means 16 illustrated in FIG. 10(a). The configuration illustrated in FIGS. 10(a) and 10(b) is the same as the configuration illustrated in FIGS. 1(a) and 1(b) except that the fixing means 16 includes the inclined surfaces 16a1 and 16a2. Thus, the fixing means 16 in FIG. 10(a) can be used instead of the fixing means 12 described in the first to third embodiments. Note that a groove 16b is formed on the fixing means 16, similarly to the groove 16b on the fixing means 12 in FIGS. 1(a) and 1(b). The insertion means 13 is movably inserted in the groove 16b, similarly to the case in FIGS. 1(a) and 1(b).

More concretely, what is obtained by wiring the fixing means 16 in FIG. 10(a) as illustrated in FIG. 10(b) is an electric leakage detecting apparatus 2a. This corresponds to the first embodiment. What is obtained by wiring the fixing means 16 in FIG. 10(a) as illustrated in FIG. 8 is an electric leakage detecting apparatus 2b. This corresponds to the second embodiment. What is obtained by wiring the fixing means 16 in FIG. 10(a) as illustrated in FIG. 9 is an electric leakage detecting apparatus 2c. This corresponds to the third embodiment.

Fifth Embodiment

Figure 13:
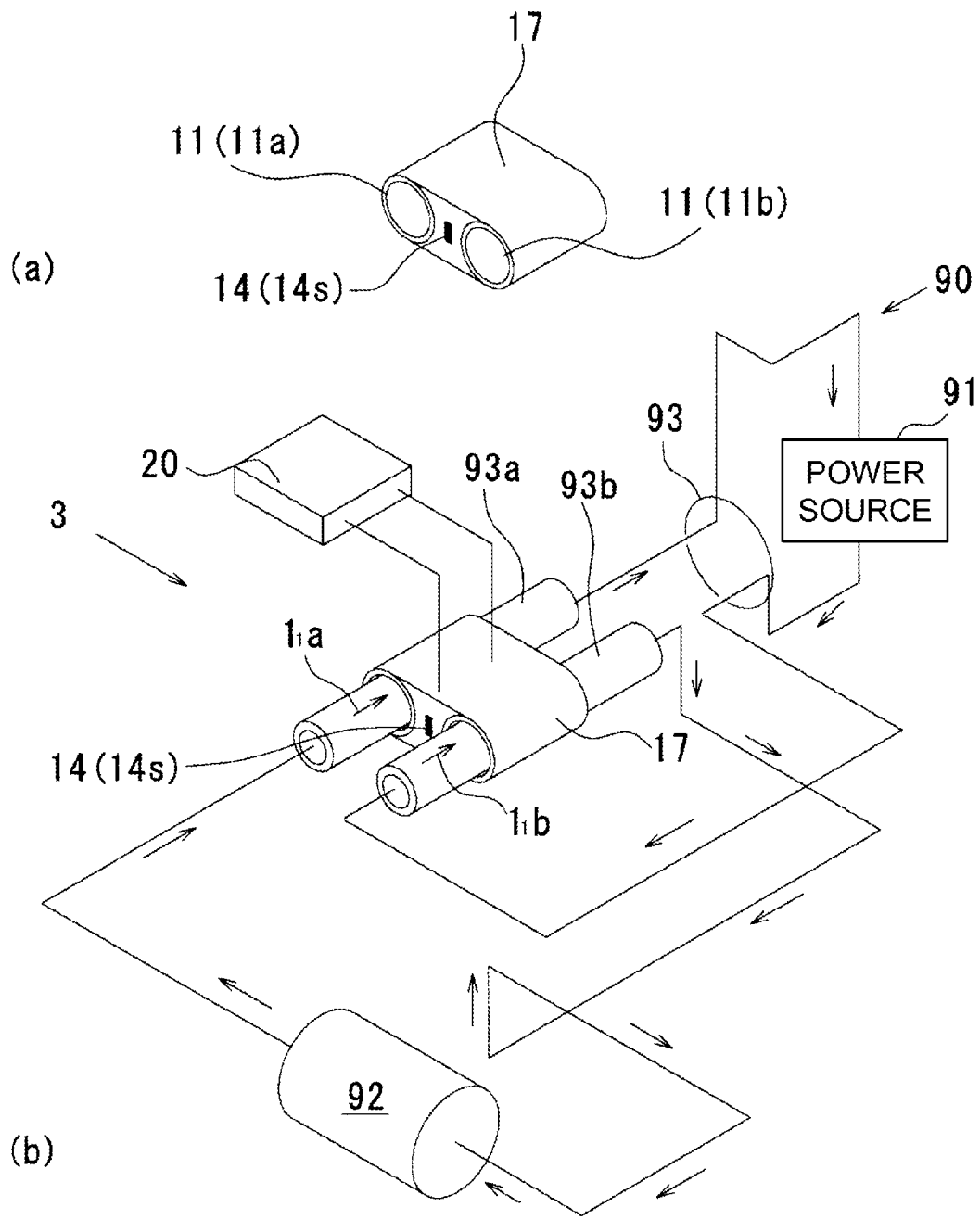
FIGS. 13(a) and 13(b) is a structure of the electric leakage detecting apparatus according to the present invention in which the magnetic element is placed at a place.

FIGS. 13(a) and 13(b) illustrate holders 11 and the like in an electric leakage detecting apparatus 3 according to the present embodiment. The holders 11 according to the present embodiment include a magnetic element 14 only in one place. Even if a plurality of magnetic elements 14 are used, the magnetic elements 14 are placed as a straight line. The holders 11 are integrated in a fixing means 17. In FIG. 13(a), the interval between a holder 11a and a holder 11b is fixed. However, the interval can also be variable. The magnetic element 14 is held between the holders 11a and 11b. The magnetic element 14 is fixed in a direction in which the magnetic fields from electric wires A93a and B93b held in the holders 11a and 11b affect the inside of the plane of the magnetic element 14. The magnetic element 14 used in the fixing means 17 is denoted with a reference sign 14s.

FIG. 13(b) illustrates the wire connection in the electric leakage detecting apparatus 3a according to the present embodiment. In the electric leakage detecting apparatus 3a, one of the electric wire A93a and the electric wire B93b is held in the holder 11 after being twisted once. In other words, one of the electric wires is twisted such that currents $I_1a$ and $I_1b$ flow in the same direction at the fixing means 17 in the electric wires A93a and B93b held with the pair of holders 11a and 11b. In other words, a loop is formed on the electric wire B93b before the electric wire B93b is held with the holder 11. Forming the loop causes the magnetic field to be zero at the magnetic element 14s when no current leaks and the currents having the same amount flow in the electric wires A93a and B93b. This is because the magnetic fields of the electric wires A93a and B93b cancel each other.

If the currents flow in the opposite directions at the fixing means 17 in the electric wire A93a and the electric wire B93b, the sum of the magnetic fields generated by the currents flowing in the electric wires A93a and B93b is applied to the magnetic element 14s. In such a case, it fails to be determined whether both of the currents flowing in the electric wires A93a and B93b have increased or decreased, or only one of the currents flowing in the electric wires A93a and B93b has increased or decreased. Making the currents $I_1a$ and $I_1b$ flow in the same direction at the fixing means 17 as illustrated in FIG. 13(b) can detect only the case in which there is a difference between the currents flowing in both of the electric wires A93a and B93b.

Figure 14:
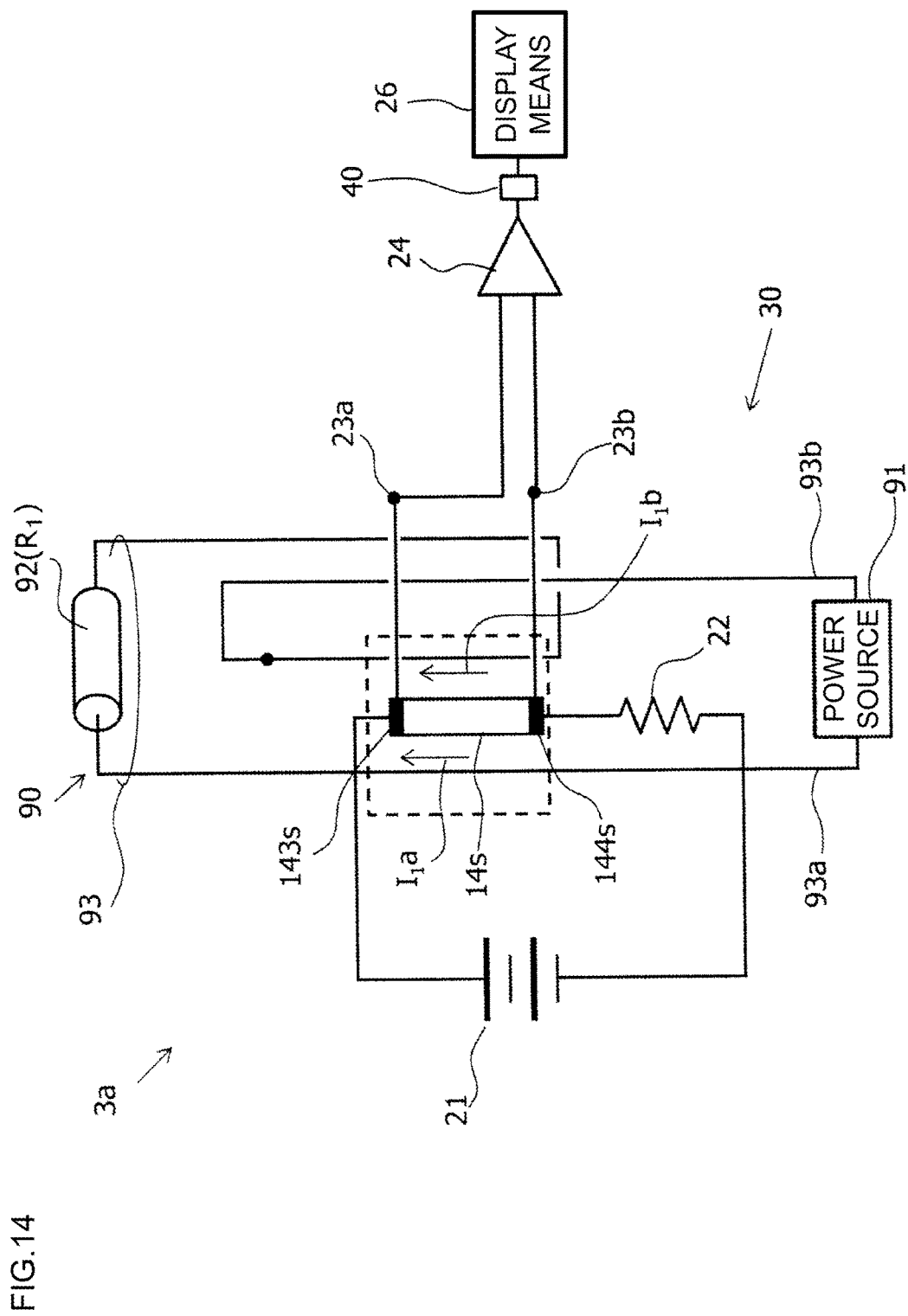
FIG. 14 is a view of the wire connection of the electric leakage detecting apparatus in FIGS. 13(a) and 13(b).

FIG. 14 illustrates the wire connection in FIG. 13(b). The electric leakage detecting apparatus using the fixing means 17 in FIGS. 13(a) and 13(b) and the wire connection in FIG. 14 is the electric leakage detecting apparatus 3a. The electric leakage detecting apparatus 3a includes a detector power source 21, a magnetic element 14s, a measuring resistance 22, a measuring terminals 23a and 23b, an amplifier 24, and a display means 26. The part surrounded with a dashed line is the electric wires A93a and B93b held with the holder 17.

The detector power source 21 that is a driving means, the magnetic element 14s, and a measuring resistance 22 connected in series to the magnetic element 14s form a circuit in the electric leakage detecting apparatus 3a. The detector power source 21 is independent from a power source 91 of a to-be-detected circuit 90. This makes it easy to install the electric leakage detecting apparatus 3a on the already-established to-be-detected circuit 90 afterward. Additionally, an objective of the detector power source 90 and the measuring resistance 22 is to feed a predetermined constant current to the magnetic element 14s. Thus, a constant-current power source can be used instead of the detector power source and the measuring resistance. The amplifier 24 and the display means 26 are connected between element terminals 143s and 144s of the magnetic element 14s. Thus, the voltage at the element terminal 143s is the same as that at the measuring terminal 23a, and the voltage at the element terminal 144s is the same as that at the measuring terminal 23b in the electric leakage detecting apparatus 3a.

The operation of the electric leakage detecting apparatus 3a according to the present embodiment will be described. The power source 91 is connected to the load 92 through the power source lines 93 (the electric wire A93a and the electric wire B93b) in the to-be-detected circuit 90. The currents $I_1a$ and $I_1b$ flow in the same direction at the fixing means 17 in the electric wires A93a and B93b because the electric wire B93b returning from the load 92 to the power source 91 is twisted once halfway.

The magnetic element 14s placed at the center of the holders 11a and 11b receives the magnetic fields from the electric wires A93a and B93b. However, the magnetic fields cancel each other. Thus, when no current leaks, no voltage arises between the element terminals 143s and 144s in the magnetic element 14s. On the other hands, when the current leaks, the current flowing in the electric wire A93a differs from the current flowing in the electric wire B93b. Consequently, an external magnetic field is applied to the magnetic element 14s.

In other words, the resistance value of the magnetic element 14s varies due to the magneto-resistance effect. The detector power source 21 feeds a predetermined current to the magnetic element 14s. This generates a voltage between the element terminals 143s and 144s in the magnetic element 14s. Amplifying the voltage in the amplifier 24 and displaying the amplified voltage on the display means 26 can notify the user of the generation of the electric leakage.

Note that, when the current leaks, it is necessary in the electric leakage detecting apparatus 3a in FIG. 14 to detect the variation in the resistance value from the resistance value without the electric leakage in the magnetic element 14s. Thus, it is necessary to record the output from the amplifier 24 when there is no electric leakage so as to sequentially compare the recorded value with the output from the amplifier 24. Thus, a memory and comparing means 40 is preferably placed for the output from the amplifier 24.

The configuration of the memory and comparing means is not especially limited as long as the memory and comparing means 40 has a function for recording the output from the amplifier 24 when no current leaks as an initial value to compare the output from the amplifier 24 after the start of the detection of an electric leakage with the default value, and sending a signal to the display means 26 when the output has varied.

When the power source 91 is a direct-current power source, the output from the amplifier 24 is also a direct-current output. When the power source 91 is an alternating-current power source, the output from the amplifier 24 is also an alternating-current output. In the electric leakage detecting apparatus 3a, the value of the current flowing in the to-be-detected circuit 90 is detected at the magnetic element 14s. Thus, when the power source 91 is an alternating-current power source, the amplitude of the output from the amplifier 24 corresponds to the variation to be detected in the current. Thus, it is preferable to insert a rectifier (not illustrated in the drawings) between the amplifier 24 and the memory and comparing means 40 so as to process a signal with direct current when the power source 91 is an alternating-current power source.

Figure 15:
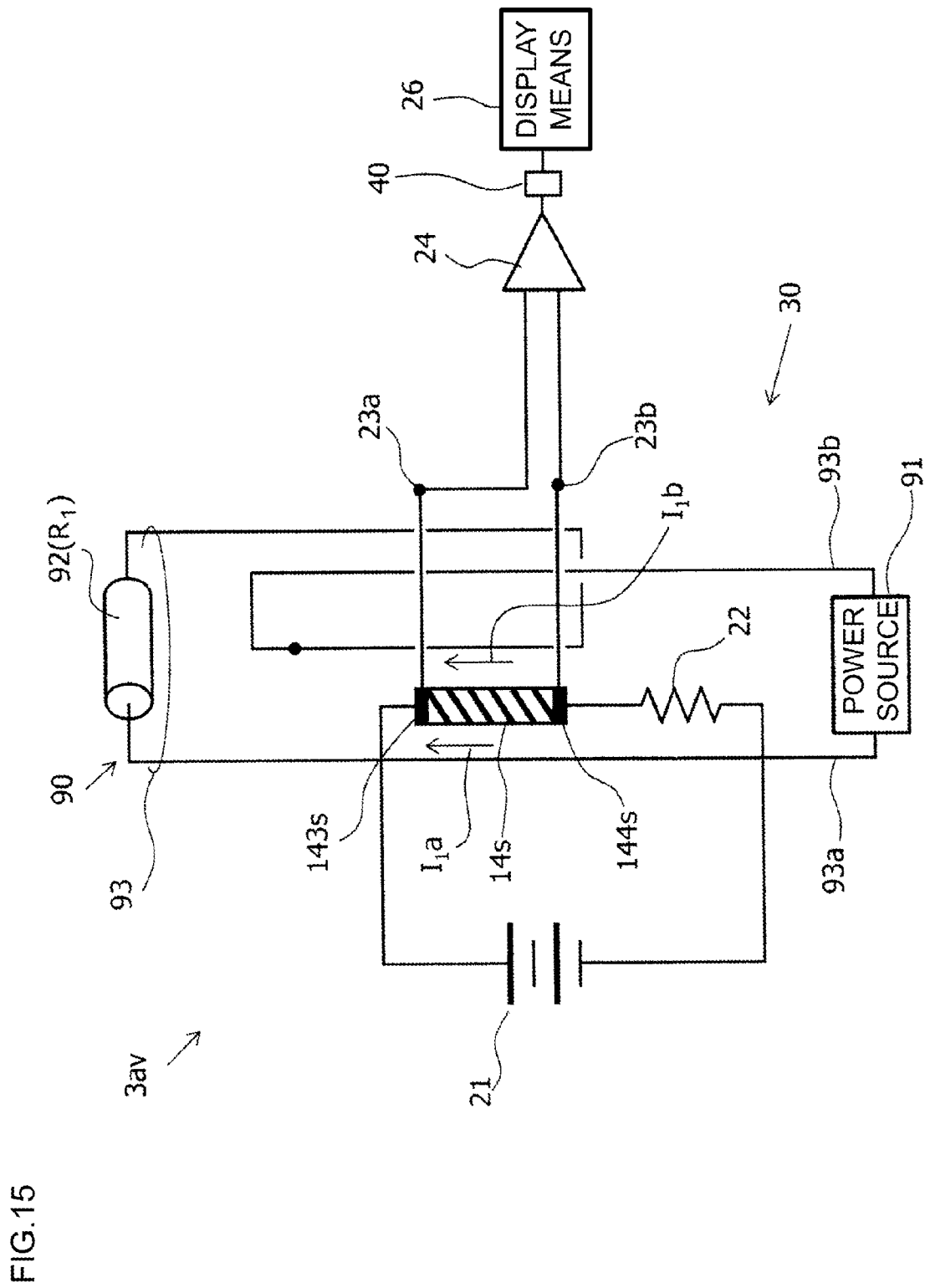
FIG. 15 is a view of the wire connection of the electric leakage detecting apparatus in FIGS. 13(a) and 13(b) when a bias means is added to the magnetic element.

Note that any magnetic element 14s including the bias means 145 can determine also from which electric wire A93a or B93b the current leaks according to the direction of the voltage variation in the amplifier 24 (the positive or negative direction). FIG. 15 illustrates the wire connection in an electric leakage detecting apparatus 3av including a barber-pole bias means 145. The electric leakage detecting apparatus 3av is the same as the electric leakage detecting apparatus 3a in FIG. 14 except that the magnetic element 14s is a barber-pole magnetic element.

Sixth Embodiment

Figure 16:
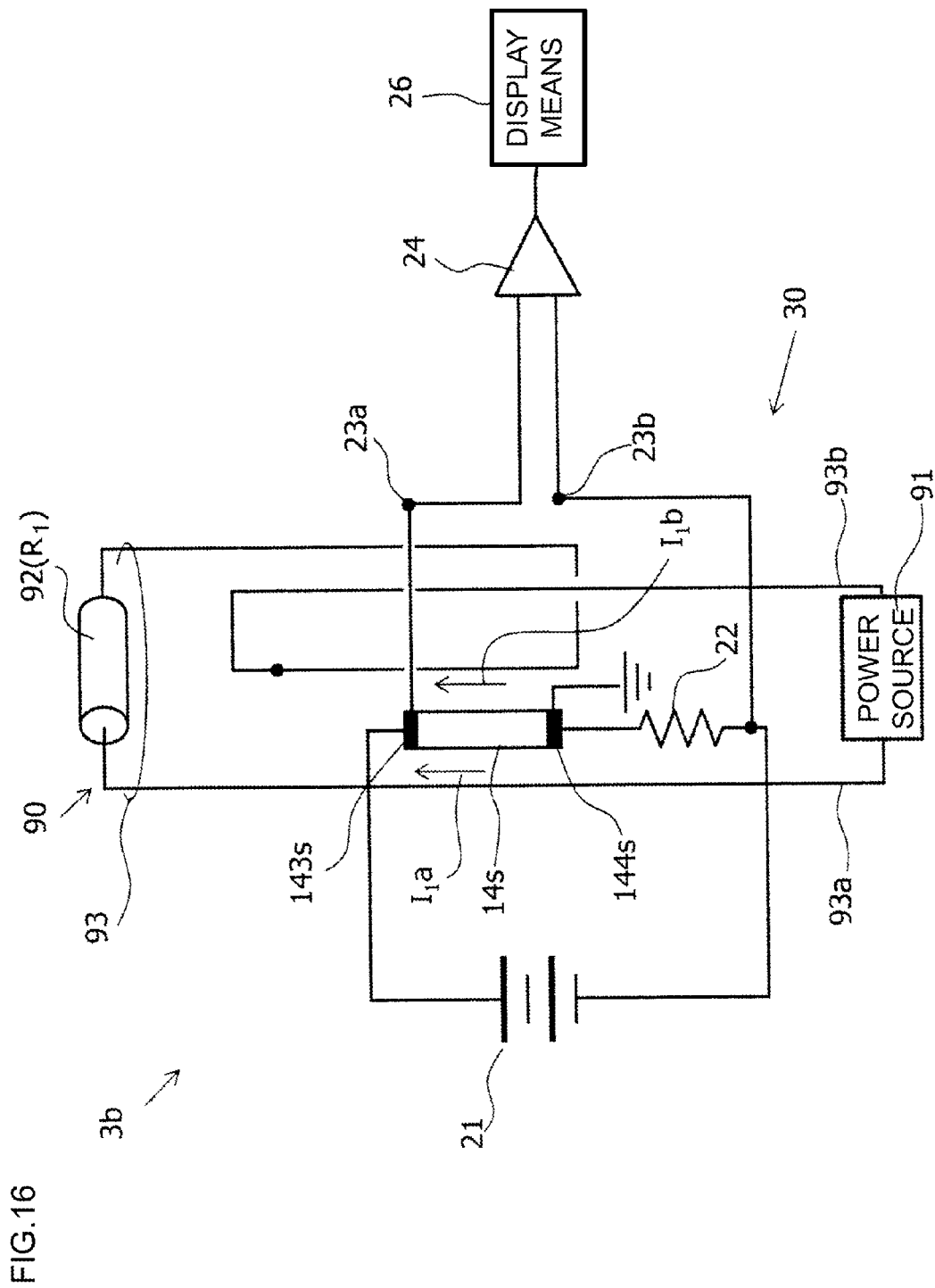
FIG. 16 is a view of the wire connection of the electric leakage detecting apparatus in FIGS. 13(a) and 13(b) when one of the element terminals is grounded.

FIG. 16 illustrates the wire connection of an electric leakage detecting apparatus 3b according to the present embodiment and relative to a to-be-detected circuit 90. The appearance including a fixing means 17 and the like is the same as the case in FIGS. 13(a) and 13(b). The difference between the present embodiment and the fifth embodiment is that a second terminal 144s (on the side connected to a first terminal of a measuring resistance 22) of a magnetic element 14s is grounded, and measuring terminals 23 are provided between a first terminal 143s of the magnetic element 14s and a second terminal of the measuring resistance 22 in the present embodiment.

The measuring resistance 22 is configured so that it has a resistance value equal to the resistance value of the magnetic element 14s. As described above, the magnetic element 14s and the measuring resistance 22 have the same resistance value, and the connecting point is grounded. This can cause the outputs on both ends of the magnetic element 14s and the measuring resistance 22 to be zero when no current leaks. Therefore, generation of the electric leakage can be detected from a predetermined voltage generated in the output from the amplifier 24.

Note that, when the power source 91 is a direct-current power source, the output from the amplifier 24 is also a direct-current output. When the power source 91 is an alternating-current power source, the output from the amplifier 24 is also an alternating-current output. Thus, a rectifier is preferably provided between the amplifier 24 and the display means 26 when the power source 91 is an alternating-current power source.

Figure 17:
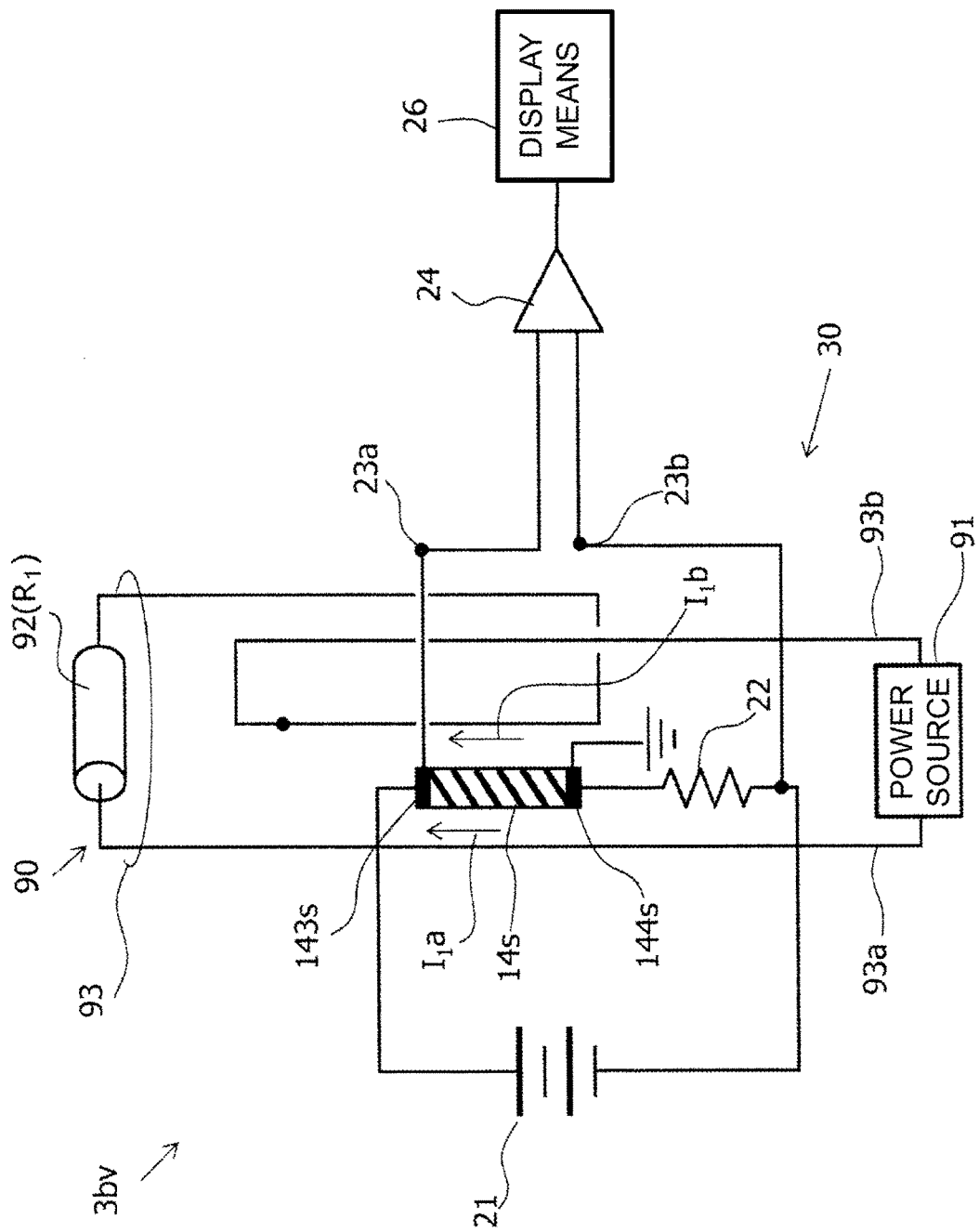
FIG. 17 is a view of the wire connection of the electric leakage detecting apparatus in FIG. 16 when a bias means is added to the magnetic element.

FIG. 17 illustrates the wire connection of an electric leakage detecting apparatus 3bv in which a magnetic element 14s includes a bias means 145. The electric leakage detecting apparatus 3bv is the same as the electric leakage detecting apparatus in FIG. 16 except for the magnetic element 14s. Providing the bias means 145 can determine from which electric wire A93a or B93b the current leaks.

Seventh Embodiment

Figure 18:
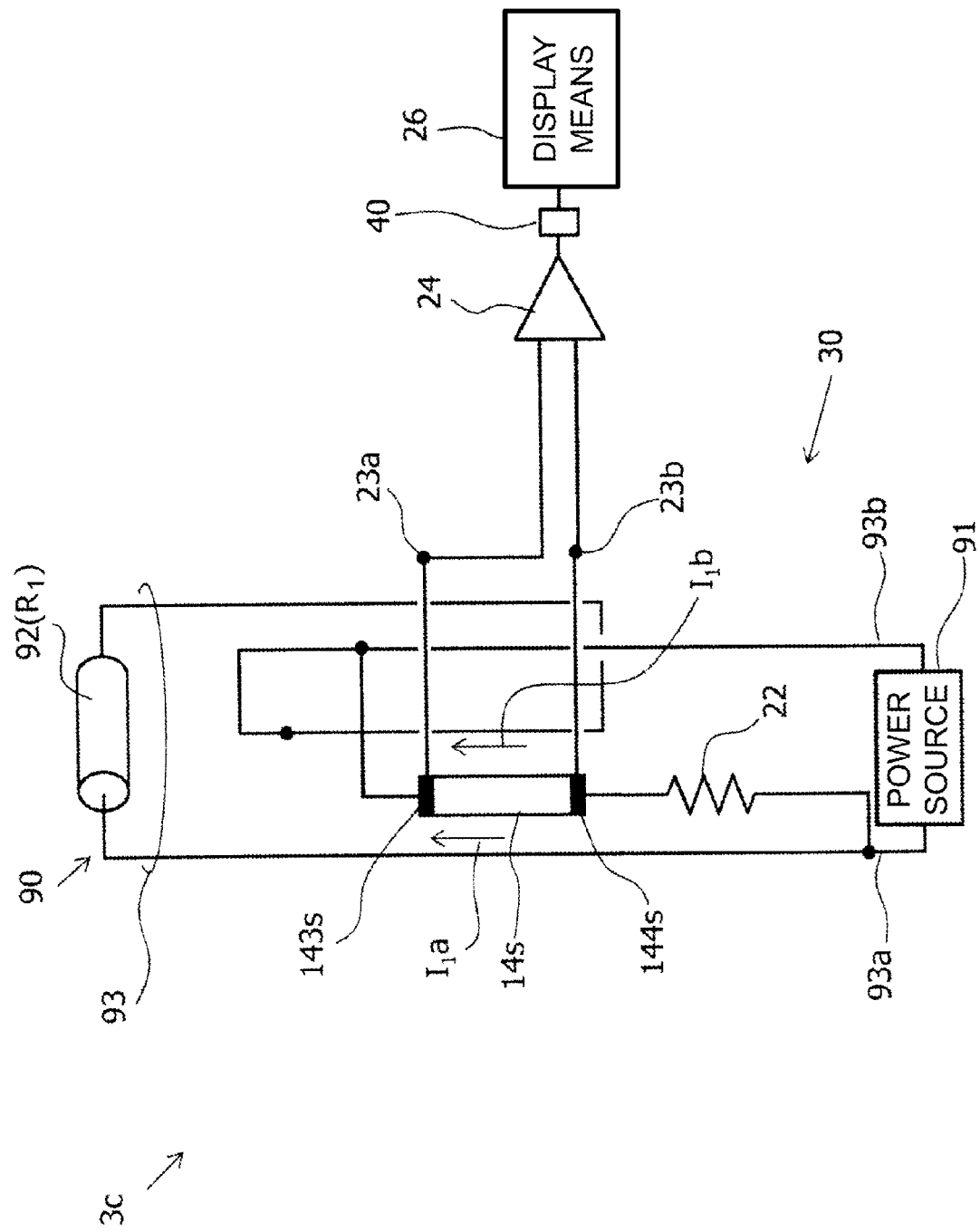
FIG. 18 is a view of the wire connection of the electric leakage detecting apparatus (with a parasite power source) in FIGS. 13(a) and 13(b) when the driving means is provided from the detected circuit.

FIG. 18 illustrates the wire connection of an electric leakage detecting apparatus 3c according to the present embodiment and relative to a to-be-detected circuit 90. The appearance including a fixing means 17 and the like is the same as the case in FIGS. 13(a) and 13(b). The magnetic element 14s is connected in series to the measuring resistance 22. The magnetic element 14s and the measuring resistance 22 are connected to a power source 91 of the to-be-detected circuit 90 parallel to the load 92. An electric wire B93b is held on a holder 11c after being twisted once so as to feed currents $I_1a$ and $I_1b$ in the same direction at the fixing means 17. An amplifier 24 is connected to element terminals 143s and 144s of the magnetic element 14s. A display means 26 is connected to the output from the amplifier 24.

The operation of the electric leakage detecting apparatus 3c according to the present embodiment will be described. When no current leaks, the magnetic fields applied to the magnetic element 14s from the electric wire A93a and the electric wire B93b cancel each other, and no magnetic field is applied to the magnetic element 14s. In other words, when the electric power consumed in the load viewed from the power source 91 is measured on the electric wire A93a side and on the electric wire B93b side, there is no difference between the two.

On the other hand, when the current leaks, the current in one of the electric wires 93 is smaller than that in the other thereof, and thus, an external magnetic field is applied to the magnetic elements 14s. The magnetic field causes the magnetic element 14s to generate a magneto-resistance effect. The effect changes the voltage between the element terminals 143s and 144s. Consequently, displaying the generated voltage on the display means 26 through the amplifier 24 enables the user to detect the generation of the electric leakage.

Note that a memory and comparing means 40 is preferably provided between the amplifier 24 and the display means 26, similarly to the case in FIG. 14 described in the fifth embodiment. This is because the electric leakage detecting apparatus 3c according to the present embodiment observes the variations in the resistance value of the magnetic element 14s as the variations in the voltage.

Note that, when the power source 91 of the to-be-detected circuit 90 is an alternating-current power source, the direct-current component in the output from the amplifier 24 can be extracted as the voltage proportional to the electric power consumed in the load 92. Thus, by providing a low-pass filter 25 on the output end of the amplifier 24, it is possible to detect an electric leakage either in a direct-current power source 91 or in an alternating-current power source 91.

Figure 19:
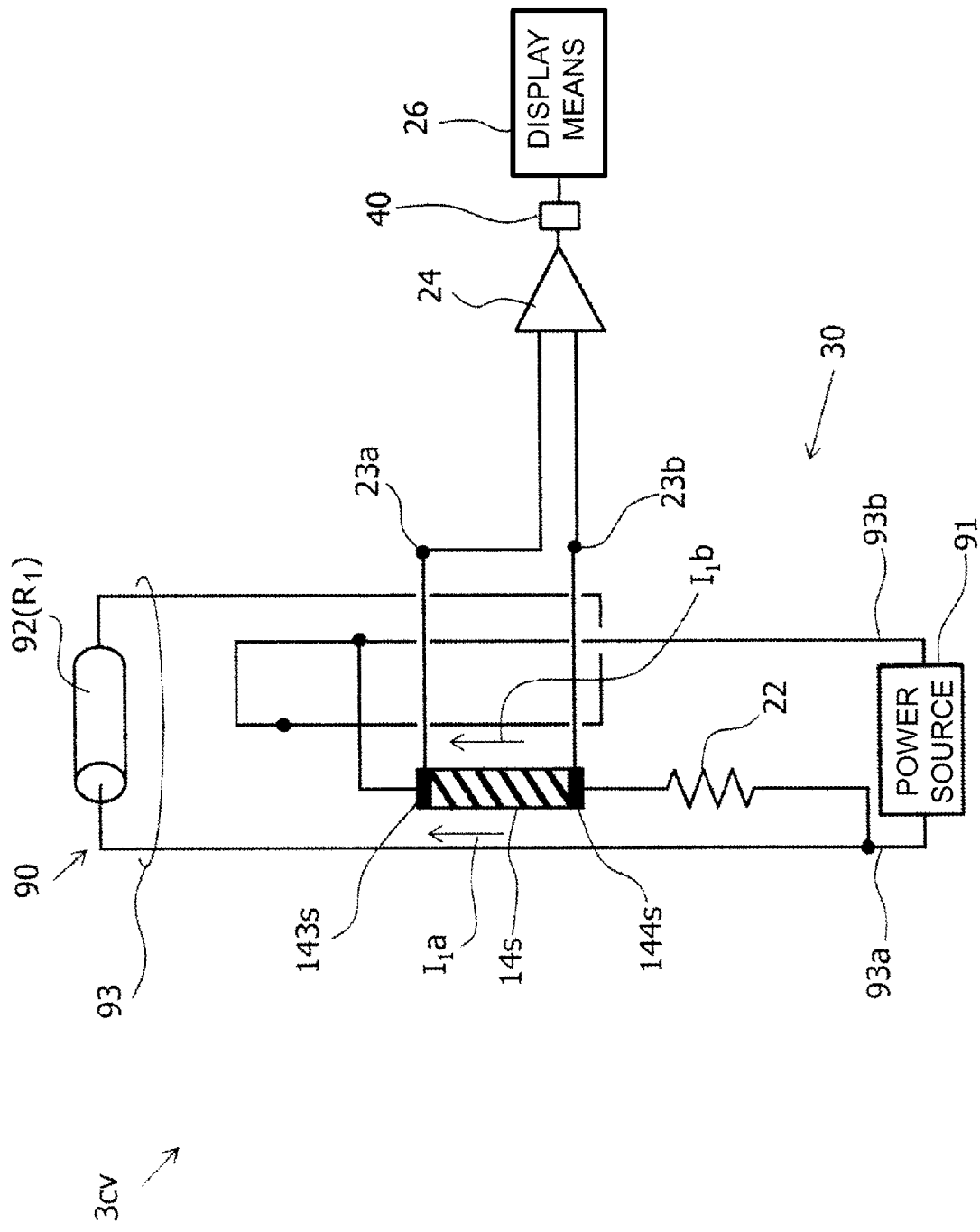
FIG. 19 is a view of the wire connection of the electric leakage detecting apparatus in FIG. 18 when a bias means is added to the magnetic element.

An electric leakage detecting apparatus 3cv in which a magnetic element 14s includes a bias means 145 will be described with reference to FIG. 19. The electric leakage detecting apparatus 3cv is the same as that in FIG. 18 except that the magnetic element 14s includes the bias means 145. By providing the bias means 145 to the magnetic element 14s, it is possible to determine from which electric wire A93a or B93b the current leaks. Note that the implement of the bias means 145 is not limited to a barber-pole magnetic element 14s as illustrated in FIG. 19.

Eighth Embodiment

Figure 20:
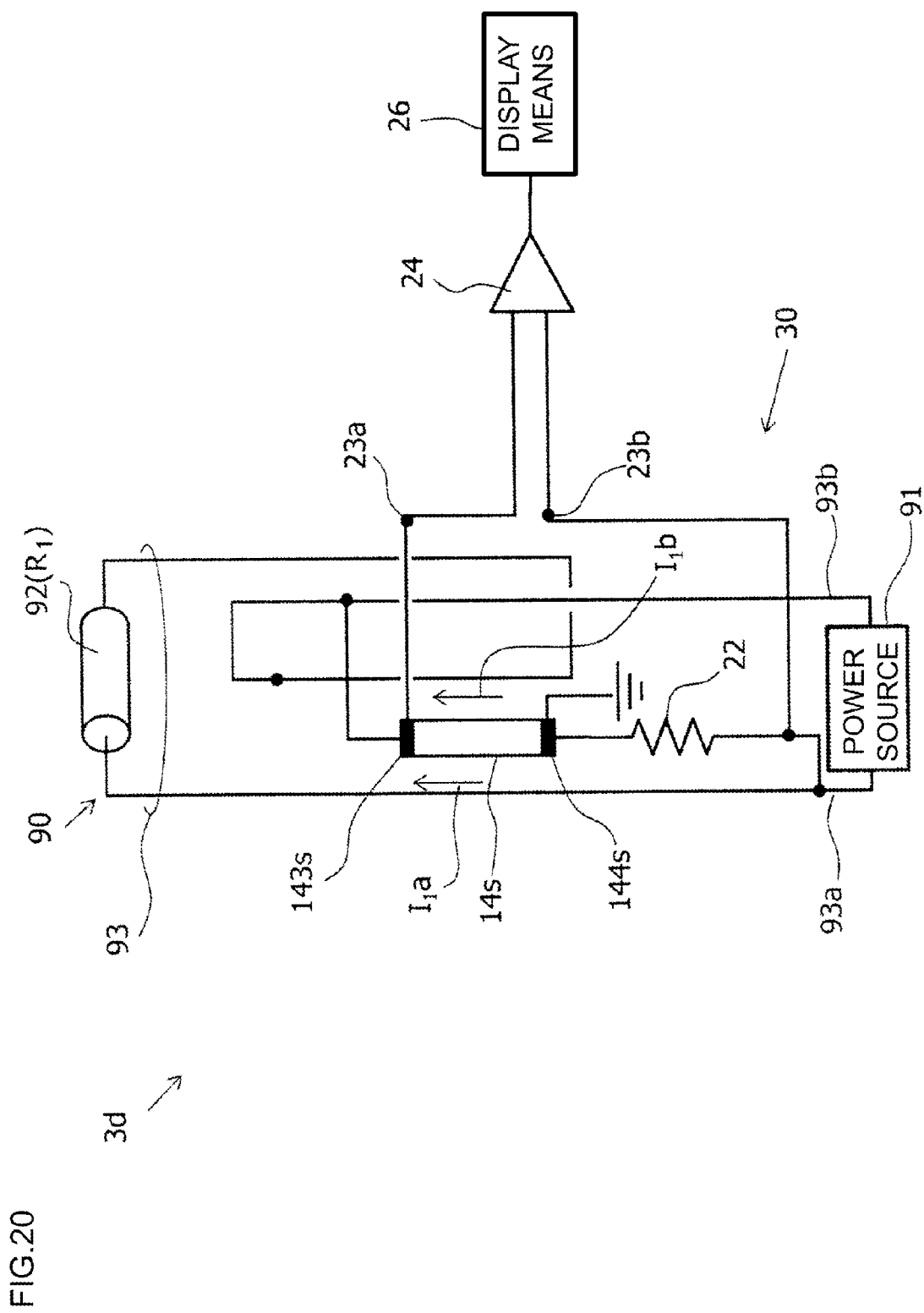
FIG. 20 is a view of the wire connection of the electric leakage detecting apparatus in FIG. 18 when one of the element terminals are grounded.

FIG. 20 illustrates the wire connection of an electric leakage detecting apparatus 3d according to the present embodiment. The appearance including a fixing means 17 and the like is the same as the case in FIGS. 13 (a) and 13(b). In the electric leakage detecting apparatus 3d, a part between the magnetic element 14s and the measuring resistance 22 that are connected in series to each other is grounded, and the magnetic element 14s and the measuring resistance 22 are configured to have the same resistance value when no external magnetic field is applied. Additionally, both ends of the magnetic element 14s and measuring resistance 22 are measuring terminals 23a and 23b. This can cause the voltage between the measuring terminals 23a and 23b to be zero. Thus, when no current leaks, the output from the amplifier 24 is zero. The generation of an output from the amplifier 24 can be used to detect the generation of the electric leakage.

Note that, when the power source 91 of the to-be-detected circuit 90 is an alternating-current power source, the direct-current component in the output from the amplifier 24 can be extracted as the voltage proportional to the electric power consumed in the load 92. Thus, by providing a low-pass filter 25 on the output end of the amplifier 24, it is possible to detect an electric leakage either in a direct-current power source 91 or in an alternating-current power source 91.

Figure 21:
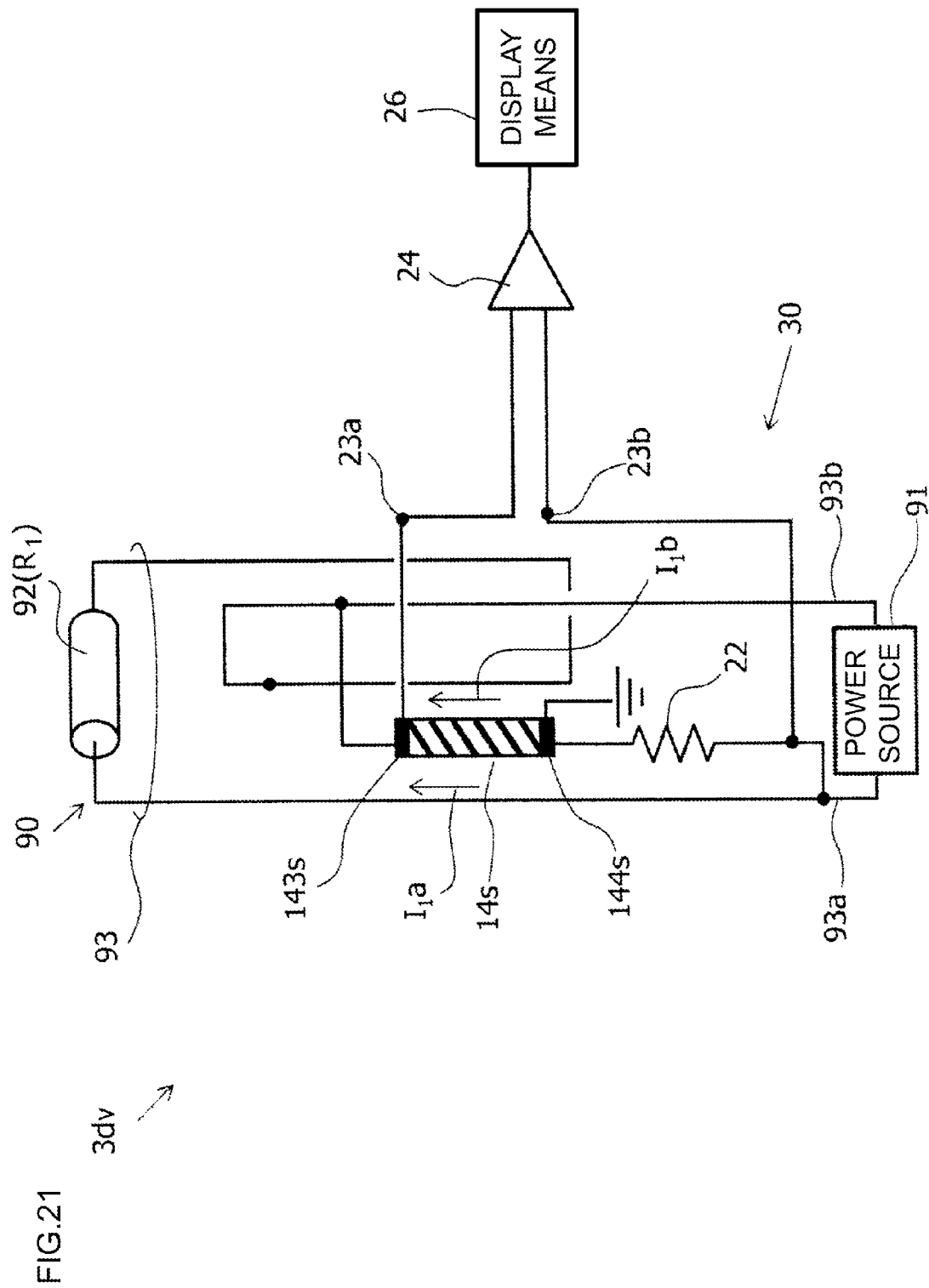
FIG. 21 is a view of the wire connection of the electric leakage detecting apparatus in FIG. 20 when a bias means is added to the magnetic element.

An electric leakage detecting apparatus 3dv in which a magnetic element 14s includes a bias means 145 will be described with reference to FIG. 21. By providing the bias means 145 to the magnetic element 14s, it is possible to determine from which of the electric wires the current leaks. Note that the implement of the bias means 145 is not limited to a barber-pole magnetic element 14s as illustrated in FIG. 21.

Ninth Embodiment

Figure 22:
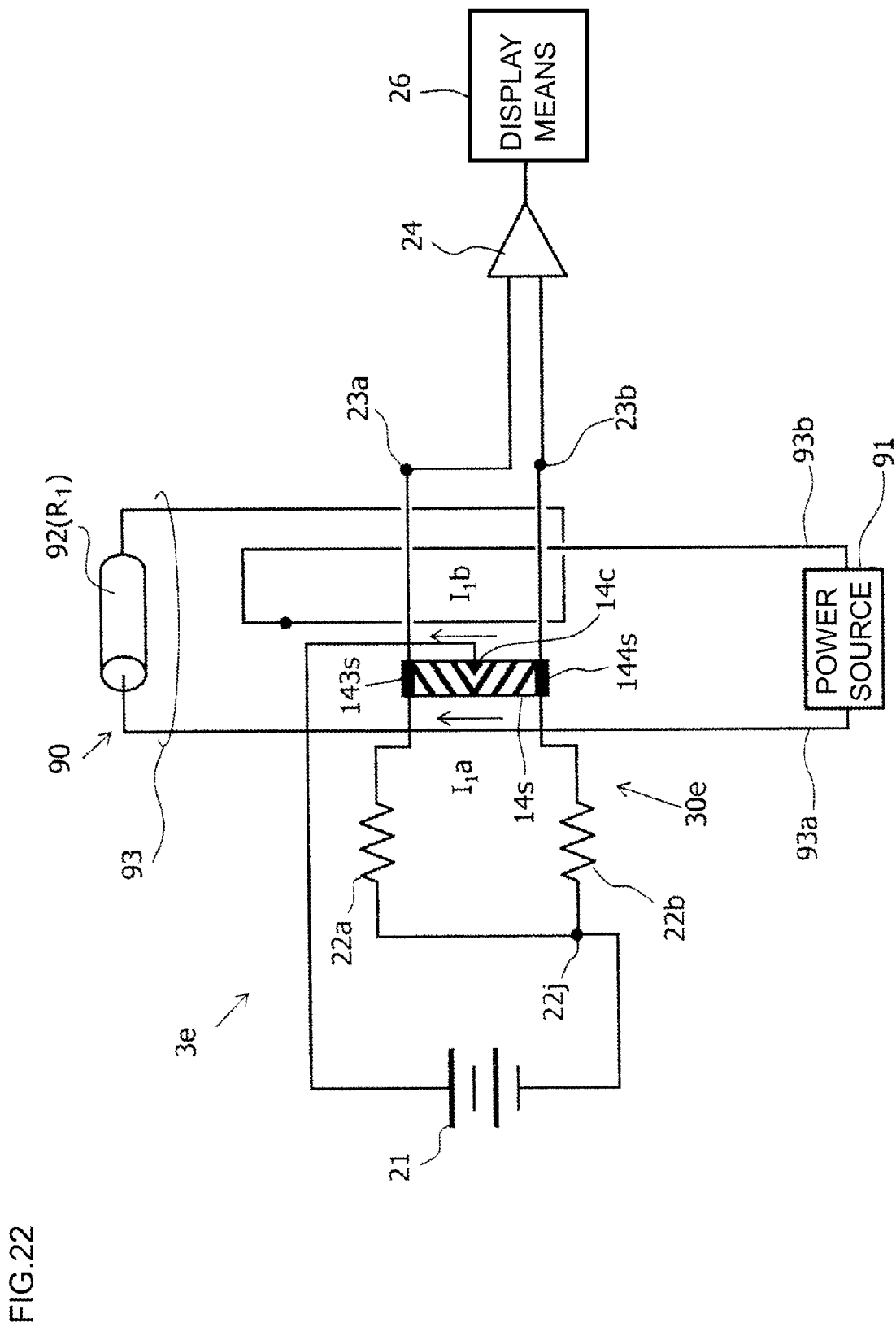
FIG. 22 is a view of the wire connection of the electric leakage detecting apparatus in FIGS. 13(a) and 13(b) when the magnetic elements to which a bias means is added are placed as a straight line.

FIG. 22 illustrates the wire connection of an electric leakage detecting apparatus 3e according to the present embodiment and relative to a to-be-detected circuit 90. The appearance including a fixing means 17 and the like is the same as the case in FIGS. 10(a) and 10(b). The magnetic element 14s is provided with two magnetic elements 14 each including a bias means 145. At least parts of the electric wires A93a and B93b at which the magnetic elements A14a and B14b are placed in the same direction are held linearly.

In FIG. 22, the barber-pole magnetic elements having a center tap 14c are connected to a pair of measuring resistances 22a and 22b so as to form a bridge circuit 30e. A pair of lines each formed of the measuring resistance 22 and magnetic element 14 connected in series is prepared, and then, the lines are connected in parallel each other to form the circuit. In other words, a pair of barber-pole magnetic elements 14 is prepared and then the barber-pole magnetic elements 14 can be placed as a straight line. Note that the bias means 145 of the magnetic elements 14 are formed or placed in the opposite directions at that time. A detector power source 21 supplies current between a node 22j which couples the measuring resistances 22a and 22b and a node 14c (the center tap means) which couples the magnetic elements A14a and B14b.

The electric wires A93a and B93b are placed in parallel to the pair of the magnetic elements A14a and B14b placed in the same direction, respectively. Needless to say, the electric wire B93b is held with a holder 11b after being twisted once. In the bridge circuit 30e, the node which couples the measuring resistances 22a and the magnetic element 14 is named as a measuring terminal 23a, and the node which couples the measuring resistance 22b and the magnetic element 14 is named as a measuring terminal 23b. A display means 26 is connected to the output from the amplifier 24.

The operation of the electric leakage detecting apparatus 3e according to the present embodiment will be described. The magnetic elements 14 each include a bias means 145, which is in the opposite direction to each of the magnetic fields generated from the electric wires A93a and B93b. For example, in FIG. 22, the current in the magnetic film flows from the center of the magnetic element 14 to the left side on the terminal element 143 side from the center tap 14c of the magnetic element 14, and the current flows from the center of the magnetic element 14 to the right side on the terminal element 144 side from the center tap 14c of the magnetic element 14.

When no current leaks, the magnetic fields generated from the electric wires A93a and B93b cancel each other at the magnetic elements 14. Thus, the output from the bridge circuit 30e is zero. In other words, when the output from the amplifier 24 is zero, no current leaks.

On the other hand, when the current leaks, the amount of the current flowing in the electric wire A93a differs from the amount of the current flowing in the electric wire B93b. This generates a magnetic field at the magnetic element 14. The magnetic field inclines the magnetization of the magnetic element 14 in a direction. However, the current flows in the different directions above and below the center tap 14c. Thus, the magnetization of the magnetic film is close to the current direction on one side, and the magnetization of the magnetic film is away from the current direction on the other side. In other words, the opposite magneto-resistance effects arise above and below the center tap 14c. The resistance value increase on one side, and the resistance value decreases on the other side. A potential difference is generated by the imbalance between the currents flowing in the paths in the bridge circuit 30e. Consequently, the potential difference can be extracted in the amplifier.

As described above, the magnetic elements 14 having the bias means 145 in the opposite directions are placed as a straight line in the electric leakage detecting apparatus 3e according to the present embodiment. This can further allow the variation in the magnetization of the magnetic film to be amplified and output the variation, thereby increasing the sensitivity of the electric leakage detecting apparatus.

Note that, when the power source 91 of the to-be-detected circuit 90 is an alternating-current power source in the electric leakage detecting apparatus 3e according to the present embodiment, the output from the amplifier 24 can also be obtained as an alternating-current output.

Tenth Embodiment

Figure 23:
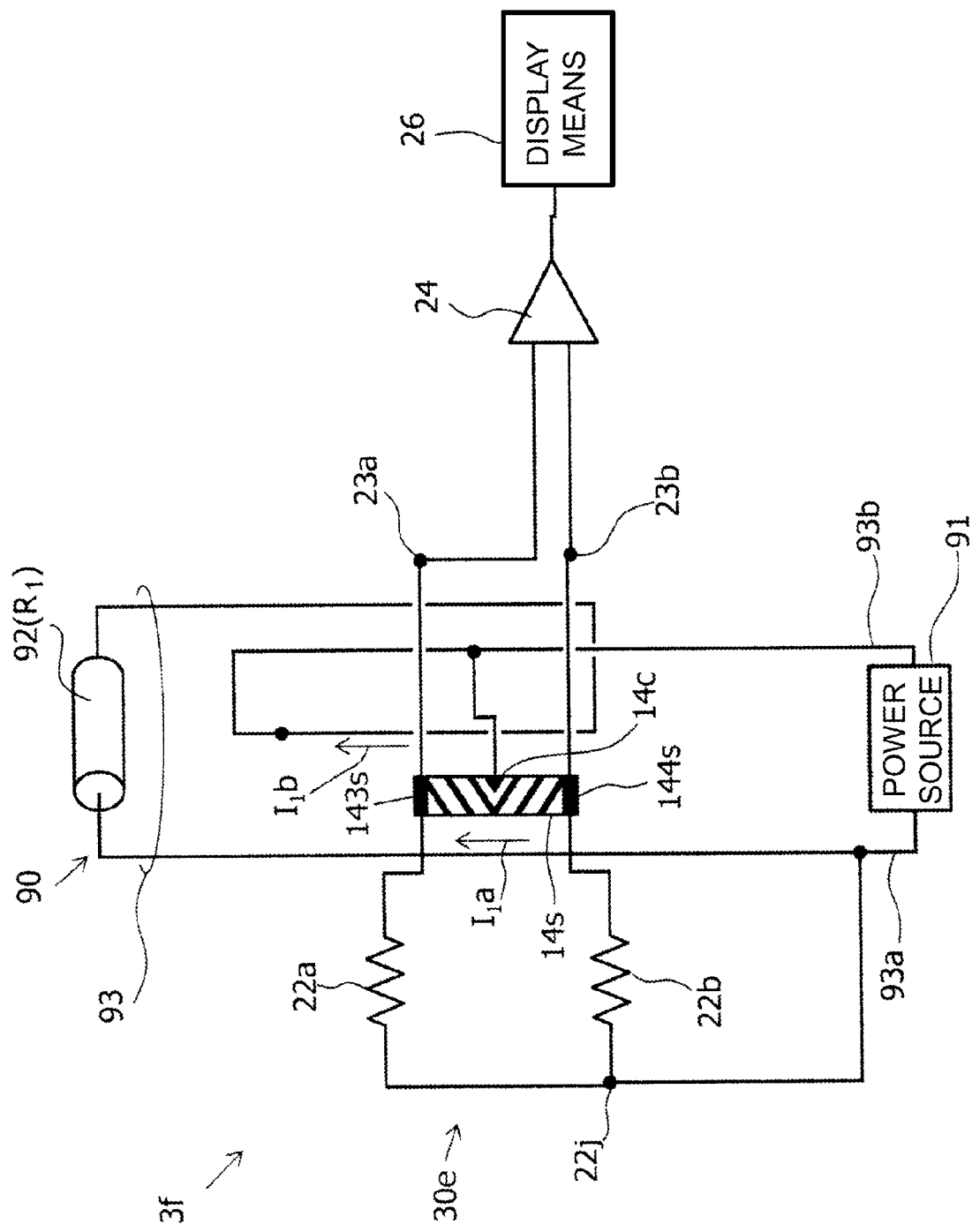
FIG. 23 is a view of the wire connection of the electric leakage detecting apparatus (with a parasite power source) in FIG. 22 when the driving means is provided from the detected circuit.
Figure 24:
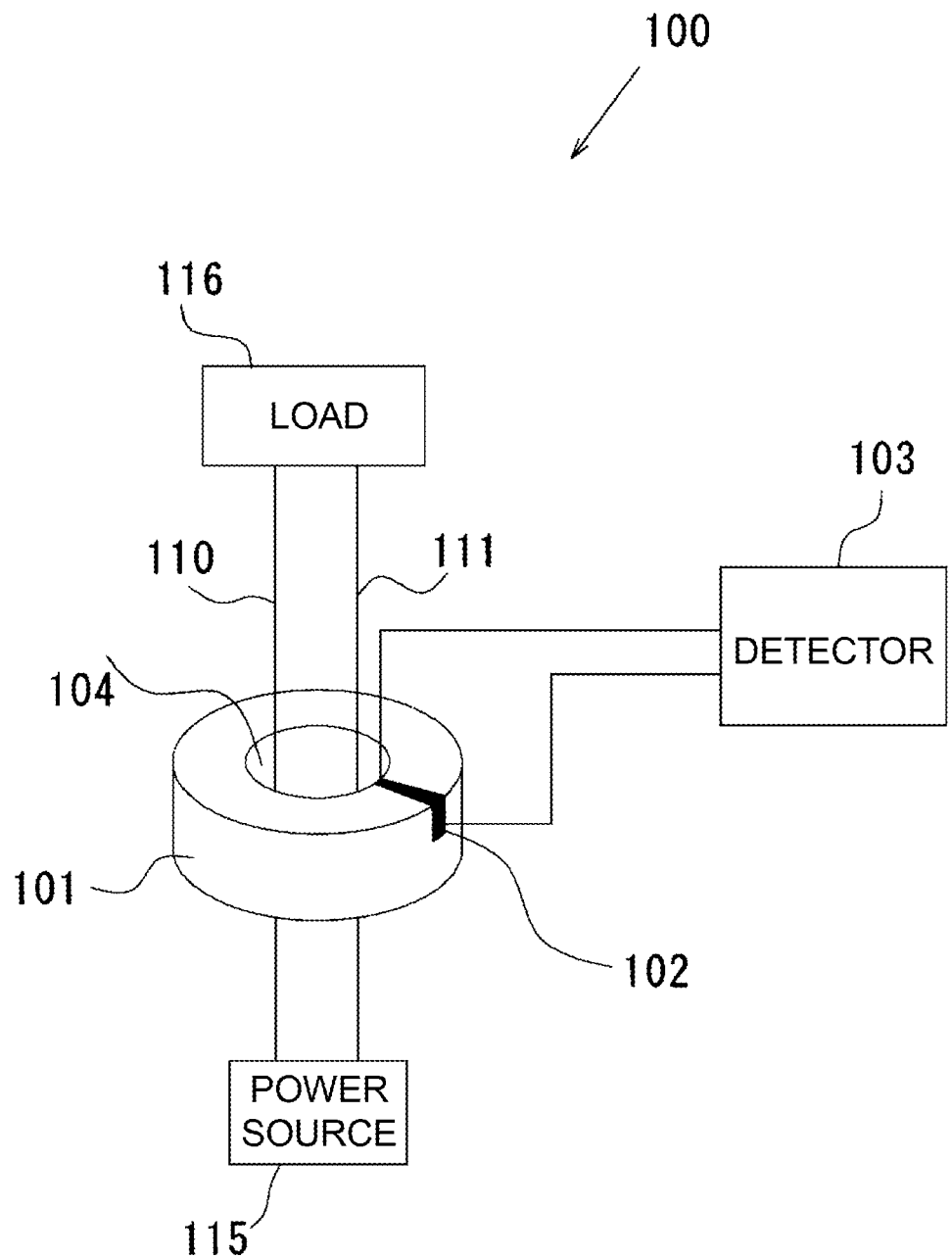
FIG. 24 is a view of the structure of a conventional electric leakage detecting apparatus.

FIG. 23 illustrates the wire connection of an electric leakage detecting apparatus 3f according to the present embodiment and relative to a to-be-detected circuit 90. The appearance including a fixing means 17 and the like is the same as the case in FIGS. 13(a) and 13(b). In the present embodiment, a bridge circuit 30e including combinations each of the magnetic element 14 and measuring resistance 22 having the same structure as the embodiment 9 is connected to a power source 91 of the to-be-detected circuit 90 parallel to a load 92. More concretely, a part 22j at which the measuring resistances 22 of the bridge circuit 30e are connected to each other is connected to a first terminal of the power source 91, and a center tap 14c of the magnetic elements 14 is connected to a second terminal of the power source 91.

The connecting points of the magnetic element 14 and the measuring resistance 22 are named as measuring terminals 23a and 23b, and an amplifier 24 is connected to the connecting points. This is the same as the embodiment 9.

Next, the operation of the electric leakage detecting apparatus 3f according to the present embodiment will be described. When no current leaks, the magnetic fields generated from the electric wires A93a and B93b cancel each other at the magnetic elements 14. In other words, no imbalance between the resistance values of the magnetic elements 14 occurs. Thus, the output from the bridge circuit 30e is zero. In other words, when the output from the amplifier 24 is zero, no current leaks.

On the other hand, when the current leaks, the resistance value varies above and below the center tap 14c of the magnetic element 14. A voltage difference is generated between the measuring terminals 23a and 23b due to the imbalance between the currents flowing in the branches in the bridge circuit 30e. Thus, the amplifier 24 generates an output voltage. In other words, when the output from the amplifier 24 can indicate the generation of an electric leakage.

Note that, when the power source 91 of the to-be-detected circuit 90 is an alternating-current power source in the present embodiment, the direct-current component in the output from the amplifier 24 is used to detect the electric power consumed by an electric leakage. Thus, by placing a low-pass filter to the output from the amplifier 24, it is possible to monitor the effective consumed electric power when the power source 91 of the to-be-detected circuit 90 is an alternating-current power source. Needless to say, when the power source 91 of the to-be-detected circuit 90 is a direct-current power source, the output from the amplifier 24 is also a direct-current output.

INDUSTRIAL APPLICABILITY

The present invention can widely be used to detect an electric leakage in the fields, for example, of home electric appliances, automobiles, and industrial equipment.

REFERENCE SIGNS LIST

1, 1b, 1c, 2, 3, 3a, 3b, 3c, 3d, 3e, 3f Electric leakage detecting apparatus
11 Holder
12, 16, 17 Fixing means
13 Insertion means
14 Magnetic element
20 Detecting means
21 Detector power source
22 Measuring resistance
23 Measuring terminal
24 Amplifier
25 Low-pass filter
26 Display means
30 Bridge circuit
32 Power detecting amplifier
34 Current detecting amplifier
35 Constant-current power source
36 Switch
40 Memory and comparing means
90 To-be-detected circuit
91 Power source
92 Load
93 Power source line
93a Electric wire A
93b Electric wire B
141 Substrate
142 Magnetic film
143, 144 Terminal element
145 Bias means
148 Conductor
149 Permanent magnet

The invention claimed is:

1. An electric leakage detecting apparatus comprising:
a first magnetic element arranged substantially parallel to a first portion of a first wire connecting a first end of a power source to a first end of a load, the first magnetic element being supplied with a first driving current;

a second magnetic element arranged substantially parallel to a second portion of a second wire connecting a second end of the power source to a second end of the load, the second magnetic element being supplied with a second driving current; and a first detector that detects a difference between a magneto-resistance effect of the first magnetic element and a magneto-resistance effect of the second magnetic element, wherein when an absolute value of a current flowing in the first portion is equal to an absolute value of a current flowing in the second portion, a resistance value of the first magnetic element is equal to a resistance value of the second magnetic element, and wherein the apparatus detects the electric leakage at the first wire and the second wire based on the difference between the magneto-resistance effect of the first magnetic element and the magneto-resistance effect of the second magnetic element.

2. The electric leakage detecting apparatus of claim 1, further comprising:
a first holder that holds the first wire;
a second holder that holds the second wire; and
a fixing member that fixes the first holder and the second holder.

3. The electric leakage detecting apparatus of claim 2, wherein the fixing member variably adjusts a distance between the first holder and the second holder.

4. The electric leakage detecting apparatus of claim 1, wherein a distance between the first wire and the first magnetic element is identical to a distance between the second wire and the second magnetic element.

5. The electric leakage detecting apparatus of claim 1, wherein
when there is no leakage, the magneto-resistance effect of the first magnetic element is identical to the magneto-resistance effect of the second magnetic element, and
when there is leakage, the magneto-resistance effect of the first magnetic element is different from the magneto-resistance effect of the second magnetic element.

6. The electric leakage detecting apparatus of claim 1, wherein, affected by an external magnetic field, a resistance value of the first magnetic element increases by a first value while a resistance value of the second magnetic element decreases by the first value.

7. The electric leakage detecting apparatus of claim 1, wherein a direction of a current flowing in the first portion of is identical to a direction of a current flowing in the second portion.

8. The electric leakage detecting apparatus of claim 1 further comprising:
a first resistance connected in series with the first magnetic element at a first node; and
a second resistance connected in series with the second magnetic element at a second node,
wherein the first detector detects the difference between the magneto-resistance effect of the first magnetic element and the magneto-resistance effect of the second magnetic element based on a difference between a voltage at the first node and a voltage at the second node.

9. The electric leakage detecting apparatus of claim 1, wherein the first driving current and the second driving current are supplied from the power source.

10. The electric leakage detecting apparatus of claim 1 further comprising a second detector that detects a voltage between both terminals of the first magnetic element.

11. The electric leakage detecting apparatus of claim 1 further comprising:
a current source;
a switch that connects the second magnetic element to the power source or to the current source; and
a third detector that detects a voltage between both terminals of the second magnetic element in a case where the second magnetic element is connected to the current source.

12. The electric leakage detecting apparatus of claim 1, wherein
the first magnetic element is arranged inclined to a line connecting a center of the first wire and a center of the second wire with a first angle, and
the second magnetic element is arranged inclined to the line connecting the center of the first wire and the center of the second wire with a second angle.

13. The electric leakage detecting apparatus of claim 12, wherein the first angle and the second angle are substantially equal to $\arcsin(r/(2r+a))$, where "r" is a radius of the first wire and the second wire, and "a" is a distance between the first wire and the second wire.

14. The electric leakage detecting apparatus of claim 1, wherein a conductor pattern inclined to a magnetization easy axis is provided on at least one of the first magnetic element and the second magnetic element.

15. The electric leakage detecting apparatus of claim 1, wherein the apparatus determines that there is a leakage when the difference between the magneto-resistance effect of the first magnetic element and the magneto-resistance effect of the second magnetic element is equal to or larger than a first threshold.

16. An electric leakage detecting method comprising the step of:
detecting the electric leakage at a first wire and a second wire based on a difference between a magneto-resistance effect of a first magnetic element and a magneto-resistance effect of a second magnetic element, the first wire connecting a first end of a power source to a first end of a load, and the second wire connecting a second end of the power source to a second end of the load,
wherein
the first magnetic element is arranged substantially parallel to a first portion of the first wire, and is supplied with a first driving current,
the second magnetic element is arranged substantially parallel to a second portion of the second wire, and is supplied with a second driving current, and
when an absolute value of a current flowing in the first portion is equal to an absolute value of a current flowing in the second portion, a resistance value of the first magnetic element is equal to a resistance value of the second magnetic element.

17. The electric leakage detecting method of claim 16, wherein it is determined that there is a leakage when the difference between the magneto-resistance effect of the first magnetic element and the magneto-resistance effect of the second magnetic element is equal to or larger than a first threshold.

* * * * *

UNITED STATES PATENT AND TRADEMARK OFFICE
CERTIFICATE OF CORRECTION

| | |
|---|---|
| PATENT NO. | : 9,903,900 B2 |
| APPLICATION NO. | : 14/406690 |
| DATED | : February 27, 2018 |
| INVENTOR(S) | : Hiroaki Tsujimoto |

Page 1 of 1

It is certified that error appears in the above-identified patent and that said Letters Patent is hereby corrected as shown below:

In the Specification

Column 17, Line 58, "comparing means is" should read --comparing means 40 is--

Signed and Sealed this
Eighth Day of May, 2018

Andrei Iancu
*Director of the United States Patent and Trademark Office*